(12) United States Patent
Suwa et al.

(10) Patent No.: US 7,374,856 B2
(45) Date of Patent: May 20, 2008

(54) POSITIVE TYPE PHOTO-SENSITIVE SILOXANE COMPOSITION, CURED FILM FORMED FROM THE COMPOSITION AND DEVICE INCORPORATING THE CURED FILM

(75) Inventors: Mitsuhito Suwa, Shiga (JP); Takenori Fujiwara, Shiga (JP); Masahide Senoo, Shiga (JP); Hirokazu Iimori, Shiga (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 11/272,791

(22) Filed: Nov. 15, 2005

(65) Prior Publication Data
US 2006/0115766 A1 Jun. 1, 2006

(30) Foreign Application Priority Data
Nov. 26, 2004 (JP) ............................ 2004-341850

(51) Int. Cl.
*G03F 7/023* (2006.01)
(52) U.S. Cl. .................. 430/169; 430/191; 430/192; 430/193
(58) Field of Classification Search ................ 430/169, 430/191, 192, 193
See application file for complete search history.

(56) References Cited

U.S. PATENT DOCUMENTS

| | | | |
|---|---|---|---|
| 5,158,854 A * | 10/1992 | Imamura et al. ............ 430/192 |
| 5,389,492 A * | 2/1995 | Kokubo et al. ............. 430/191 |
| 5,953,084 A | 9/1999 | Shimada et al. | |
| 6,797,453 B2 * | 9/2004 | Shiraki et al. ........... 430/270.1 |
| 6,899,991 B2 * | 5/2005 | Kato et al. ............... 430/270.1 |
| 6,949,324 B2 * | 9/2005 | Watanabe et al. ........ 430/270.1 |
| 2003/0211407 A1 | 11/2003 | Watanabe et al. | |

FOREIGN PATENT DOCUMENTS

| | | |
|---|---|---|
| JP | 03-059667 | 3/1991 |
| JP | 07-098502 | 4/1995 |
| JP | 10-153854 | 6/1998 |
| JP | 2001-281853 | 10/2001 |

* cited by examiner

*Primary Examiner*—John S. Chu
(74) *Attorney, Agent, or Firm*—Morrison & Foerster LLP

(57) ABSTRACT

A positive photosensitive siloxane composition having high photosensitivity and having such properties as high heat resistance, high transparency and low dielectric constant may be used to form a planarization film for a TFT substrate, an interlayer dielectrics or a core or cladding of an optical waveguide. The positive photosensitive siloxane composition includes a siloxane polymer, quinonediazide compound and solvent, and a cured film formed of the composition has a light transmittance per 3 μm of film thickness at a wavelength of 400 nm of 95% or more.

20 Claims, No Drawings

POSITIVE TYPE PHOTO-SENSITIVE SILOXANE COMPOSITION, CURED FILM FORMED FROM THE COMPOSITION AND DEVICE INCORPORATING THE CURED FILM

TECHNICAL FIELD

The present invention relates to a positive photosensitive siloxane composition used for forming planarization films for thin film transistor (TFT) substrates of liquid crystal display elements, organic Electro-Luminescence (EL) display elements and the like, interlayer dielectrics of semiconductor elements, and cores and claddings of optical waveguides, and also relates to a cured film formed of it and an element having the cured film.

BACKGROUND ART

In recent years, for example, in liquid crystal displays and organic EL displays, a method for enhancing the aperture ratio of a display device is known as a method for achieving further higher precision and higher resolution (U.S. Pat. No. 5,953,084). In this method, a transparent planarization film is provided on a TFT substrate as a protective film, to allow data lines and pixel electrodes to overlap on each other, for enhancing the aperture ratio compared with the prior art.

The materials used as the planarization films for TFT substrates are required to have high heat resistance, high transparency and low dielectric constant, and the conventional materials include a material made by combining a phenyl-based resin and a quinonediazide compound (JP7-98502A) and a material made by combining an acrylic resin and a quinonediazide compound (JP10-153854A, JP2001-281853A). However, these materials are insufficient in heat resistance and have a problem that if they are treated at a high temperature as substrates made by using them, the cured films made of them are colored to decline in transparency.

On the other hand, a siloxane polymer is known as a material having high heat resistance, high transparency and low dielectric constant. As materials made by combining a quinonediazide compound with a siloxane polymer to let the siloxane polymer have positive photosensitivity, known are a material made by combining a siloxane polymer having phenolic hydroxyl groups at the ends and a quinonediazide compound (U.S. Patent Publication No. 2003/211407), and a material made by combining a siloxane polymer having phenolic hydroxyl groups, carboxyl groups or the like added by cyclization and heat addition reaction and a quinonediazide compound (JP3-59667A). However, these materials cannot be used as highly transparent materials, for such reasons that since they contain a large amount of a quinonediazide compound or have phenolic hydroxyl groups existing in the siloxane polymer, the coating films formed of them are likely to be opaqued or colored during curing. Furthermore, they also have a problem that the photosensitivity during patterning is low, since they are low in transparency.

SUMMARY OF THE INVENTION

The present invention has been completed based on the situations as described above. An object of this invention is to provide a positive photosensitive siloxane composition having high photosensitivity and having such properties as high heat resistance, high transparency and low dielectric constant, used to form a planarization film for a TFT substrate, an interlayer dielectrics or a core or cladding of an optical waveguide. Another object of this invention is to provide a cured film formed of said positive photosensitive siloxane composition, used as a planarization film for a TFT substrate, interlayer dielectrics, core or cladding, and also to provide an element having the cured film such as a display element, semiconductor element or optical waveguide.

This invention is a positive photosensitive siloxane composition comprising a siloxane polymer, quinonediazide compound and solvent, characterized in that the light transmittance of the cured film formed of the composition at a wavelength of 400 nm per 3 μm film thickness is 95% or more.

Another mode of this invention is a positive photosensitive siloxane composition comprising a siloxane polymer, quinonediazide compound and solvent, characterized in that the chromaticity coordinates (x, y) of the light transmitted through a 3 μm thick cured film formed of the composition in the XYZ color system using light source C or light source F10 are $(x-x_0)^2+(y-y_0)^2 \leq 6\times10^{-6}$ in reference to the chromaticity coordinates $(x_0, y_0)$ of the light source C or light source F10.

The positive photosensitive siloxane composition of this invention does not cause the coating film formed of it to be opaqued or colored during curing, and can provide a cured film having such properties as high heat resistance, high transparency and low dielectric constant. Furthermore, the obtained cured film can be patterned to have through holes, and can be suitably used as a planarization film for a TFT substrate or as an interlayer dielectrics.

DETAILED DESCRIPTION OF THE INVENTION

This invention provides a composition comprising a siloxane polymer, quinonediazide compound and solvent and can form a cured film having a light transmittance of 95% or more at a wavelength of 400 nm per 3 μm film thickness. The light transmittance at a wavelength of 400 nm per 3 μm film thickness must be 95% or more. Preferred is 98% or more. If the light transmittance is lower than 95%, in the case where the cured film is used as a planarization film for a TFT substrate of a liquid crystal display element, color change occurs to make whiteness yellowish when backlight passes.

The light transmittance at a wavelength of 400 nm per 3 μm film thickness can be obtained by the following method. A Tempax glass sheet is spin-coated with the composition using a spin coater at a given rotating speed, and a hot plate is used for pre-baking at 100° C. for 2 minutes. Then, as bleaching exposure, a parallel light mask aligner (PLA) is used to expose the entire film surface to an ultra high pressure mercury lamp at 6000 J/m$^2$ (in terms of wavelength 365 nm exposure energy value), and an oven is used for curing at 250° C. in air for 1 hour, to prepare a 3 μm thick cured film. The absorption spectrum of the obtained cured film in the ultraviolet and visible region is measured using MultiSpec-1500 produced by Shimadzu Corporation, and the light transmittance at a wavelength of 400 nm is obtained.

Another mode of this invention is a composition comprising a siloxane polymer, quinonediazide compound and solvent, characterized in that the chromaticity coordinates (x, y) of the light transmitted through a 3 μm thick cured film formed of said composition in the XYZ color system using light source C or light source F10 are $(x-x^0)^2+(y-y_0)^2 \leq 6\times$ $10^{-6}$ in reference to the chromaticity coordinates $(x_0, y_0)$ of the light source C or light source F10. If the value of $(x-x^0)^2+(y-y_0)^2$ is larger than $6\times10^{-6}$, in the case where the cured film is used as a planarization film for a TFT substrate of a liquid crystal display element, color change occurs to make whiteness yellowish when backlight passes.

The above-mentioned chromaticity coordinates (x, y) of the light transmitted through said cured film in the XYZ color system using light source C or light source F10 can be obtained by the following method. A Tempax glass sheet is spin-coated with the composition using a spin coater at a given rotating speed, and a hot plate is used to pre-bake at 100° C. for 2 minutes. Then, as bleaching exposure, a parallel light mask aligner (PLA) is used to expose the entire film surface to an ultra high pressure mercury lamp at 6000 J/m² (in terms of wavelength 365 nm exposure energy value), and an oven is used for curing at 250° C. in air for 1 hour, to prepare a 3 μm thick cured film. The transmission spectrum of the obtained cured film is measured using a microspectrophotometer (MCPD-2000 produced by Otsuka Electronics Co., Ltd.), and from the spectrum, the reference stimuli X, Y and Z with light source C or light source F10 are calculated, to obtain chromaticity coordinates (x, y).

Moreover, the photosensitivity of the positive photosensitive siloxane composition of this invention in exposure to an ultra high pressure mercury lamp in terms of wavelength 365 nm exposure energy value is from 100 to 1500 J/m². If the photosensitivity is larger than 1500 J/m², the radiation exposure time during patterning becomes long to lower productivity and to increase the radiation exposure, thereby increasing the reflection from the underlying substrate to degrade the pattern form.

The photosensitivity in exposure to an ultra high pressure mercury lamp can be obtained by the following method. A silicon wafer is spin-coated with the composition using a spin coater at a given rotating speed, and a hot plate is used to pre-bake at 100° C. for 2 minutes, to prepare a 4 μm thick film. The prepared film is exposed using PLA to an ultra high pressure mercury lamp through a gray scale mask for photosensitivity measurement, and showered with 2.38 wt % tetramethylammonium hydroxide aqueous solution for 80 seconds for development using an automatic processing machine (AD-2000 produced by Takizawa Sangyo Co., Ltd.), then being rinsed with water for 30 seconds. In the formed pattern, the exposure energy value at which a 10 μm line and space pattern can be resolved at a width ratio of 1:1 is identified as the photosensitivity.

This invention must contain a siloxane polymer, quinonediazide compound and solvent and must have the aforesaid light transmittance and/or chromaticity coordinates. The particular composition for carrying out the invention is described below.

The positive photosensitive siloxane composition of this invention contains a siloxane polymer. The siloxane polymer is not especially limited, but preferred is a siloxane polymer, the phenolic hydroxyl group content of which is 20 mol % or less based on the amount of Si atoms. If the phenolic hydroxyl group content based on the amount of Si atoms is larger than 20 mol %, the decomposition of phenolic hydroxyl groups caused during curing causes outstanding coloration, to lower the colorless transparency of the cured film.

A more preferred siloxane polymer is a siloxane polymer obtained by mixing one or more organosilanes represented by the following general formula (4) for reaction, or a siloxane polymer obtained by mixing one or more straight chain polysiloxanes represented by the following general formula (5) for reaction, or a siloxane polymer obtained by mixing one or more organosilanes represented by the following general formula (4) and one or more straight chain polysiloxanes represented by the following general formula (5) for reaction.

where $R^7$ denotes a hydrogen atom, alkyl group with 1 to 10 carbon atoms, alkenyl group with 2 to 10 carbon atoms or aryl group with 6 to 15 carbon atoms, and the plural $R^7$s can be identical with or different from each other; $R^8$ denotes a hydrogen atom, alkyl group with 1 to 6 carbon atoms, acyl group with 1 to 6 carbon atoms or aryl group with 6 to 15 carbon atoms, and plural $R^8$s can be identical with or different from each other; and m denotes an integer of 0 to 3.

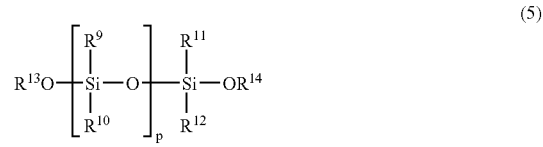

where $R^9$, $R^{10}$, $R^{11}$ and $R^{12}$ denote, respectively independently, a hydrogen atom, alkyl group with 1 to 6 carbon atoms, alkenyl group with 2 to 6 carbon atoms or aryl group with 6 to 15 carbon atoms, and plural $R^9$s and $R^{10}$s can be respectively identical with or different from each other; $R^{13}$ and $R^{14}$ denote, respectively independently, a hydrogen atom, alkyl group with 1 to 6 carbon atoms, acyl group with 1 to 6 carbon atoms or aryl group with 6 to 15 carbon atoms; and p denotes a number in a range from 1 to 1000.

In the general formula (4), $R^7$ denotes a hydrogen atom, alkyl group with 1 to 10 carbon atoms, alkenyl group with 2 to 10 carbon atoms or aryl group with 6 to 15 carbon atoms, and plural $R^7$s can be identical with or different from each other. Furthermore, the alkyl group, alkenyl group or aryl group can be either a non-substituted group or a substituted group which can be selected in response to the intended properties of the composition. Examples of the alkyl group include a methyl group, ethyl group, n-propyl group, isopropyl group, n-butyl group, t-butyl group, n-hexyl group, n-decyl group, trifluoromethyl group, 3,3,3-trifluoropropyl group, 3-glycidoxypropyl group, 2-(3,4-epoxycyclohexyl)ethyl group, 3-aminopropyl group, 3-mercaptopropyl group and 3-isocyanatopropyl group. Examples of the alkenyl group include a vinyl group, 3-acryloxypropyl group and 3-methacryloxypropyl group. Examples of the aryl group include a phenyl group, tolyl group, p-hydroxyphenyl group, 1-(p-hydroxyphenyl)ethyl group, 2-(p-hydroxyphenyl)ethyl group, 4-hydroxy-5-(p-hydroxyphenylcarbonyloxy)pentyl group and naphthyl group.

In the general formula (4), $R^8$ denotes a hydrogen atom, alkyl group with 1 to 6 carbon atoms, acyl group with 1 to 6 carbon atoms or aryl group with 6 to 15 carbon atoms, and plural $R^8$s can be identical with or different from each other. Furthermore, the alkyl group, acyl group or aryl group can be either a non-substituted group or a substituted group which can be selected in response to the intended properties of the composition. Examples of the alkyl group include a methyl group, ethyl group, n-propyl group, isopropyl group and n-butyl group. Examples of the acyl group include an acetyl group. Examples of the aryl group include a phenyl group.

In the general formula (4), m denotes an integer of 0 to 3. If m denotes 0, the formula represents a tetra-functional silane. If m denotes 1, the formula represents a tri-functional silane. If m denotes 2, the formula represents a di-functional silane. If m denotes 3, the formula represents a mono-functional silane.

Examples of the organosilane represented by the general formula (4) include tetra-functional silanes such as tetramethoxysilane, tetraethoxysilane, tetraacetoxysilane and tetraphenoxysilane, tri-functional silanes such as methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-acryloxypropyltrimethoxysilane, 3-acryloxypropyltriethoxysilane, 3-methacryloxypropyltrimethoxysilane, 3-methacryloxypropyltriethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane and 3-mercaptopropyltrimethoxysilane, di-functional silanes such as dimethyldimethoxysilane, dimethyldiethoxysilane, dimethyldiacetoxysilane, di-n-butyldimethoxysilane, diphenyldimethoxysilane, (3-glycidoxypropyl)methyldimethoxysilane and (3-glycidoxypropyl)methyldiethoxysilane, mono-functional silanes such as trimethylmethoxysilane, tri-n-butylethoxysilane, (3-glycidoxypropyl)dimethylmethoxysilane and (3-glycidoxypropyl)dimethylethoxysilane. Any one of these organosilanes can be used, or two or more of them can also be used in combination: Among these organosilanes, a tri-functional silane can be preferably used in view of the crack resistance and hardness of the cured film.

In the general formula (5), $R^9$, $R^{10}$, $R^{11}$ and $R^{12}$ denote, respectively independently, a hydrogen atom, alkyl group with 1 to 6 carbon atoms, alkenyl group with 2 to 6 carbon atoms or aryl group with 6 to 15 carbon atoms, and plural $R^9$s and $R^{10}$s can be respectively identical with or different from each other. Furthermore, the alkyl group, alkenyl group or aryl group can be either a non-substituted group or a substituted group which can be selected in response to the intended properties of the composition. Examples of the alkyl group include a methyl group, ethyl group and n-propyl group. Examples of the alkenyl group include a vinyl group, acryloxypropyl group and methacryloxypropyl group. Examples of the aryl group include a phenyl group, tolyl group and naphthyl group.

In the genera formula (5), $R^{13}$ and $R^{14}$ denote, respectively independently, a hydrogen atom, alkyl group with 1 to 6 carbon atoms, acyl group with 1 to 6 carbon atoms or aryl group with 6 to 15 carbon atoms. The alkyl group, acyl group or aryl group can be either a non-substituted group or a substituted group which can be selected in response to the intended properties of the composition. Examples of the alkyl group include a methyl group, ethyl group, n-propyl group, isopropyl group and n-butyl group. Examples of the acyl group include an acetyl group. Examples of the aryl group include a phenyl group.

In the general formula (5), p denotes a number in a range from 1 to 1000. A preferred range is from 2 to 100, and a more preferred range is from 3 to 50. If p is larger than 1000, the coating film becomes opaque, and it is difficult to obtain a highly transparent film.

Examples of the straight chain polysiloxane represented by the general formula (5) include 1,1,3,3-tetramethyl-1,3-dimethoxydisiloxane, 1,1,3,3-tetramethyl-1,3-diethoxydisiloxane, 1,1,3,3-tetraethyl-1,3-dimethoxydisiloxane, 1,1,3,3-tetraethyl-1,3-diethoxydisiloxane, silanol terminal polydimethylsiloxanes produced by Gelest Inc. such as (trade names are enumerated below) "DMS-S12" (molecular weight 400 to 700), "DMS-S15" (molecular weight 1500 to 2000), "DMS-S21" (molecular weight 4200), "DMS-S27" (molecular weight 18000), "DMS-S31" (molecular weight 26000), "DMS-S32" (molecular weight 36000), "DMS-S33" (molecular weight 43500), "DMS-S35" (molecular weight 49000), "DMS-S38" (molecular weight 58000), and "DMS-S42" (molecular weight 77000), silanol terminal diphenylsiloxane-dimethylsiloxane copolymers produced by Gelest Inc. such as "PSD-0332" (molecular weight 35000, having 2.5 to 3.5 mol % of diphenylsiloxane copolymerized), "PDS-1615" (molecular weight 900 to 1000, having 14 to 18 mol % of diphenylsiloxane copolymerized), silanol terminal polydiphenylsiloxanes produced by Gelest Inc. such as "PDS-9931" (molecular weight 1000 to 1400). Any one of these straight chain polysiloxanes can be used, or two or more of them can also be used in combination.

If a straight chain polysiloxane is used, the storage stability of the composition is improved. The reason is that since straight chain portions exist like bridges, the unreactive silanol groups are unlikely to approach each other, and that while the composition is stored, condensation reaction as a side reaction is unlikely to occur.

In the case where any organosilane represented by the general formula (4) and any straight chain polysiloxane represented by the general formula (5) are used as a mixture, the mixing ratio is not especially limited. However, a preferred ratio of organosilane/straight chain polysiloxane in the number of Si atom-moles is 100-50/0-50. If the amount of the straight chain polysiloxane is larger than 50 mol %, phase separation occurs, and the coating film becomes opaque to lower the transparency. However, as described before, since it is preferred that the phenolic hydroxyl group content in the siloxane polymer is 20 mol % or less based on the amount of Si atoms in view of the high transparency to be kept in the cured film, it is preferred that the added amount of the organosilane having a phenolic hydroxyl group is 20 mol % or less as the number of Si atom-moles.

Furthermore, in view of both the crack resistance and hardness of the cured film, it is preferred that the phenyl group content in the siloxane polymer is from 5 to 60 mol % based on the amount of Si atoms. If the phenyl group content is larger than 60 mol %, the hardness declines, and if the phenyl group content is smaller than 5 mol %, the crack resistance declines. The phenyl group content can be obtained by measuring the $^{29}$Si-nuclear magnetic resonance spectrum ($^{29}$Si-NMR) of the siloxane polymer and calculating the ratio of the peak area of Si having a phenyl group bonded to the peak area of Si having no phenyl group bonded.

The weight average molecular weight (Mw) of the siloxane polymer used in this invention is not especially limited, but it is preferred that the molecular weight as polystyrene measured by GPC (gel permeation chromatography) is from 1000 to 100000. A more preferred range is from 2000 to 50000. If Mw is lower than 1000, the coatability declines, and if it is larger than 100000, the dissolvability of the composition in the developing solution during patterning declines.

The siloxane polymer of this invention can be obtained by hydrolyzing and partially condensing said organosilane and/ or said straight chain polysiloxane. For the hydrolysis and partial condensation, a general method can be used. For example, a solvent, water and as required a catalyst are added to the mixture, and the obtained mixture is heated and stirred at 50 to 150° C. for about 0.5 to about 100 hours. During stirring, as required, the hydrolysis byproduct (alcohols such as methanol) and condensation byproduct (water) can also be removed by distillation.

The reaction solvent for the above is not especially limited, but usually any of the same solvents as those described later can be used. It is preferred that the added amount of the solvent is from 10 to 1000 parts by weight per 100 parts by weight of the mixture consisting of the organosilane and the straight chain polysiloxane. It is preferred that the added amount of water used for the hydrolysis reaction is from 0.5 to 2 moles per 1 mole of the hydrolyzable groups.

The catalyst added as required is not especially limited, and an acid catalyst or a base catalyst can be preferably used. Examples of the acid catalyst include hydrochloric acid, nitric acid, sulfuric acid, hydrofluoric acid, phosphoric acid, acetic acid, trifluoroacetic acid, formic acid, polycarboxylic acids and their anhydrides, and ion exchange resins. Examples of the base catalyst include triethylamine, tripropylamine, tributylamine, tripentylamine, trihexylamine, triheptylamine, trioctylamine, diethylamine, triethanolamine, diethanolamine, sodium hydroxide, potassium hydroxide, alkoxysilanes having an amino group and ion exchange resins. It is preferred that the added amount of the catalyst is from 0.01 to 10 parts by weight per 100 parts by weight of the mixture consisting of the organosilane and the straight chain polysiloxane.

Furthermore, in view of the storage stability of the composition, it is preferred that the siloxane polymer solution obtained after hydrolysis and partial condensation does not contain any catalyst, and the catalyst can be removed as required. The method for removing the catalyst is not especially limited, but washing with water or a method of using an ion exchange resin is preferred. Washing with water is a method in which the siloxane polymer solution is diluted using an adequate hydrophobic solvent and is washed with water several times, the organic layer obtained being concentrated using an evaporator. In the removing method using an ion exchange resin, the siloxane polymer solution is brought into contact with an adequate ion exchange resin.

The positive photosensitive siloxane composition of this invention contains a quinonediazide compound. The added amount of the quinonediazide compound is not especially limited, but it is preferred that the amount is 0.1 to 10 wt % based on the weight of the siloxane polymer. A more preferred range is from 0.1 to 4 wt %. If the added amount of the quinonediazide compound is smaller than 0.1 wt %, the dissolution contrast between the exposed area and the non-exposed area is too low to provide realistic photosensitivity. Furthermore, to obtain a further good dissolution contrast, it is preferred that the amount is 1 wt % or more.

If the added amount of the quinonediazide compound is larger than 4 wt %, the compatibility between the siloxane polymer and the quinonediazide compound declines to opaque the coating film or to decompose the quinonediazide compound during curing, for causing remarkable coloration, thereby lowering the colorless transparency of the cured film. If the added amount of the quinonediazide compound is larger than 10 wt %, the transparency of the cured film declines further, and it can happen that sufficient transparency cannot be achieved. If the added amount of the quinonediazide compound is kept in a range from 4 wt % to 10 wt %, a cured film with good colorless transparency can be obtained by changing the process conditions in the bleaching step, curing step, etc.

The quinonediazide compound is not especially limited, but a compound having naphthoquinonediazidesulfonic acid ester-bonded to a compound having a phenolic hydroxyl group is preferred. A compound, in which the ortho position and the para position of the phenolic hydroxyl group are, respectively independently, occupied by a hydrogen atom or a substituent group represented by the following general formula (1), can be preferably used as the quinonediazide compound.

where $R^1$, $R^2$ and $R^3$ denote, respectively independently, an alkyl group with 1 to 10 carbon atoms, carboxyl group, phenyl group or substituted phenyl group. Furthermore, $R^1$, $R^2$ and $R^3$ can also form a ring.

In the substituent group represented by the general formula (1), $R^1$, $R^2$ and $R^3$ denote, respectively independently, an alkyl group with 1 to 10 carbon atoms, carboxyl group, phenyl group or substituted phenyl group. The alkyl group can be either a non-substituted group or a substituted group which can be selected in response to the intended properties of the composition. Examples of the alkyl group include a methyl group, ethyl group, n-propyl group, isopropyl group, n-butyl group, isobutyl group, t-butyl group, n-hexyl group, cyclohexyl group, n-heptyl group, n-octyl group, trifluoromethyl group and 2-carboxyethyl group. The substituent group substituting the phenyl group can be a hydroxyl group. Furthermore, $R^1$, $R^2$ and $R^3$ can also form a ring. Examples of the ring include a cyclopentane ring, cyclohexane ring, adamantane ring and fluorene ring.

If each group at the ortho position and the para position of the phenolic hydroxyl group is other than the above groups, for example, a methyl group, curing causes oxidative decomposition, and a conjugated compound typified by a quinoid structure is formed to color the cured film, thus lowering the colorless transparency. Meanwhile, the quinonediazide compound can be synthesized by the esterification reaction between a compound having a phenolic hydroxyl group and naphthoquinonediazidesulfonic acid chloride.

Examples of the compound having a phenolic hydroxyl group include the following compounds (all of them are produced by Honshu Chemical Industry Co., Ltd.).

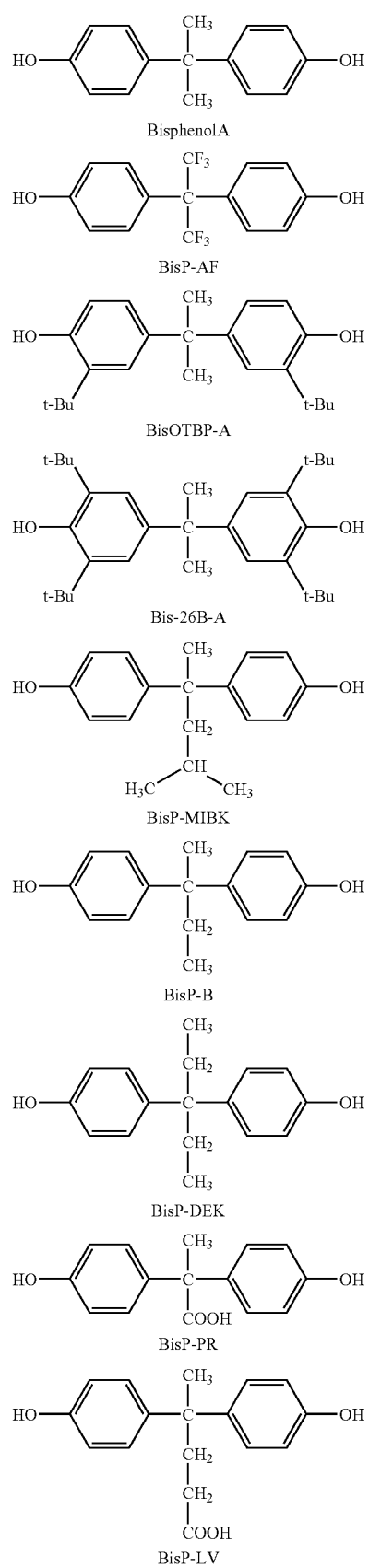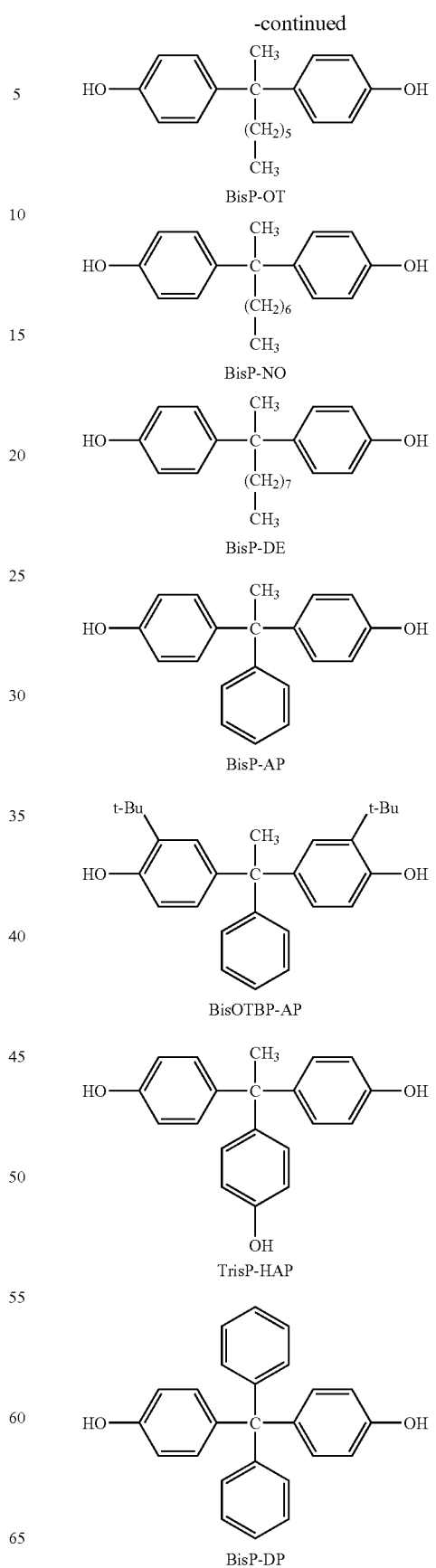

-continued

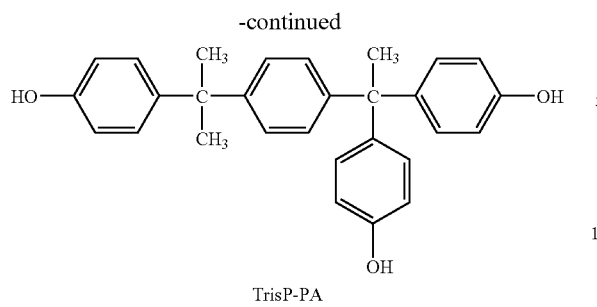

TrisP-PA

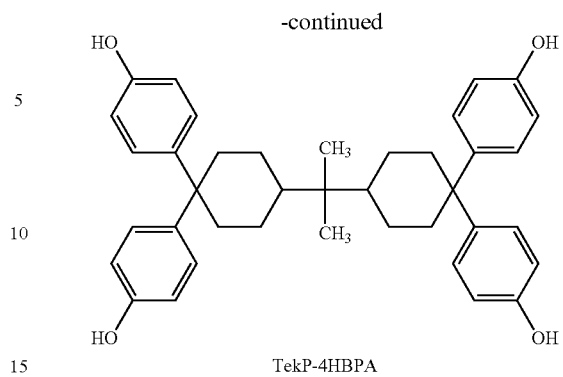

TekP-4HBPA

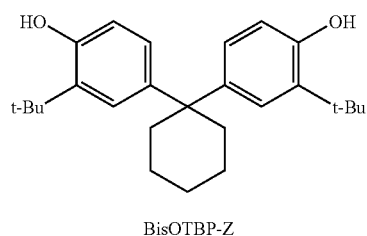

BisOTBP-Z

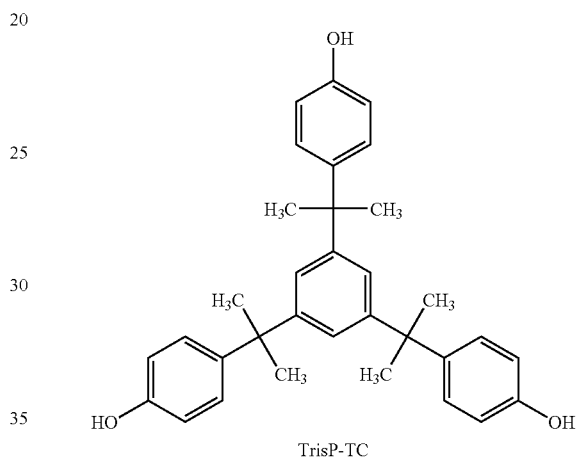

TrisP-TC

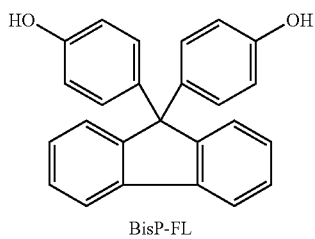

BisP-FL

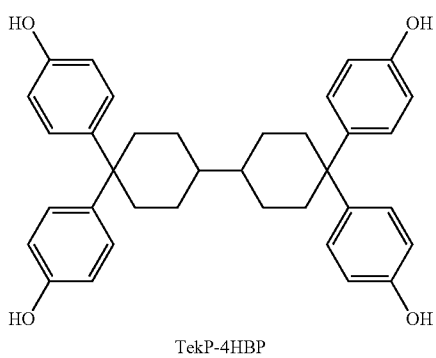

TekP-4HBP

As the naphthoquinonediazidesulfonic acid, either 4-naphthoquinonediazidesulfonic acid or 5-naphthoquinonediazidesulfonic acid can be used. A 4-naphthoquinonediazidesulfonic ester compound is suitable for i-line exposure, since it can absorb light with a wavelength of i-line (365 nm) region. Furthermore, a 5-naphthoquinonediazidesulfonic ester compound is suitable for exposure in a wide range of wavelengths, since it can absorb light in a wide range of wavelengths. It is preferred to select a 4-naphthoquinonediazidesulfonic ester compound or a 5-naphthoquinonediazidesulfonic ester compound, depending on the wavelength used for exposure. A mixture consisting of a 4-naphthoquinonediazidesulfonic ester compound and a 5-naphthoquinonediazidesulfonic ester compound can also be used.

It is preferred that the molecular weight of the naphthoquinonediazide compound is from 300 to 1500. A more preferred range is from 350 to 1200. If the molecular weight of the naphthoquinonediazide compound is higher than 1500, it may happen that patterning cannot be performed even if the added amount is from 0.1 to 10 wt % or from 0.1 to 4 wt %. On the other hand, if the molecular weight of the naphthoquinonediazide compound is lower than 300, the colorless transparency may decline.

The positive photosensitive siloxane composition of this invention contains a solvent. The solvent is not especially limited, but a compound having an alcoholic hydroxyl group and/or a cyclic compound having a carbonyl group can be preferably used. If these solvents are used, the siloxane polymer and the quinonediazide compound can be homogeneously dissolved, and even if the composition is applied to form a film, the film is not opaqued and can achieve high transparency.

The compound having an alcoholic hydroxyl group is not especially limited, but a compound having a boiling point of 110 to 250° C. at atmospheric pressure is preferred. If the boiling point of the compound is higher than 250° C., the amount of the solvent remaining in the film becomes large, and the film is shrunken greatly during curing, not allowing good planarization property to be obtained. On the other hand, if the boiling point is lower than 110° C., the coating film is dried so fast that the film surface is, for example, roughened to lower coatability.

Examples of the compound having an alcoholic hydroxyl group include acetol, 3-hydroxy-3-methyl-2-butanone, 4-hydroxy-3-methyl-2-butanone, 5-hydroxy-2-pentanone, 4-hydroxy-4-methyl-2-pentanone (diacetone alcohol), ethyl lactate, butyl lactate, propylene glycol monomethyl ether, propylene glycol monoethyl ether, propylene glycol mono-n-propyl ether, propylene glycol mono-n-butyl ether, propylene glycol mono-t-butyl ether, 3-methoxy-1-butanol and 3-methyl-3-methoxy-1-butanol. Among them, a compound having further a carbonyl group is preferred, and especially diacetone alcohol can be preferably used. Any one of these compounds having an alcoholic hydroxyl group can be used, or two or more of them can also be used in combination.

The cyclic compound having a carbonyl group is not especially limited, but a compound having a boiling point of 150 to 250° C. at atmospheric pressure is preferred. If the boiling point is higher than 250° C., the amount of the solvent remaining in the film becomes large, and the film is shrunken greatly during curing, not allowing good planarization property to be obtained. On the other hand, if the boiling point is lower than 150° C., the coating film is dried so fast that the film surface is, for example, roughened to lower coatability.

Examples of the cyclic compound having a carbonyl group include γ-butyrolactone, γ-valerolactone, δ-valerolactone, propylene carbonate, N-methylpyrrolidone, cyclohexanone and cycloheptanone. Among them, especially γ-butyrolactone can be preferably used. Any one of the cyclic compounds having a carbonyl group can be used, or two or more of them can also be used in combination.

Either of said compound having an alcoholic hydroxyl group and said cyclic compound having a carbonyl group can be used, or both the compounds can also be used as a mixture. In the case where both the compounds are used as a mixture, the ratio of them by weight is not especially limited, but it is preferred that the ratio of the compound having an alcoholic hydroxyl group/the cyclic compound having a carbonyl group is 99-50/1-50. A more preferred ratio is 97-60/3-40. If the amount of the compound having an alcoholic hydroxyl group is larger than 99 wt % (if the amount of the cyclic compound having a carbonyl group is smaller than 1 wt %), the compatibility between the siloxane polymer and the quinonediazide compound declines, to opaque the cured film and to lower the transparency. Furthermore, if the amount of the compound having an alcoholic hydroxyl group is smaller than 50 wt % (if the amount of the cyclic compound having a carbonyl group is larger than 50 wt %), the condensation reaction of unreactive silanol groups in the siloxane polymer is likely to occur, thus lowering the storage stability.

The positive photosensitive siloxane compound of this invention may also contain another solvent unless the effects of this invention are impaired. Examples of the other solvent include esters such as ethyl acetate, n-propyl acetate, isopropyl acetate, n-butyl acetate, isobutyl acetate, propylene glycol monomethyl ether acetate, 3-methoxy-1-butyl acetate and 3-methyl-3-methoxy-1-butyl acetate, ketones such as methyl isobutyl ketone, diisopropyl ketone and diisobutyl ketone and ethers such as diethyl ether, diisopropyl ether, di-n-butyl ether and diphenyl ether.

The added amount of the solvent is not especially limited, but it is preferred that the amount of the solvent is in a range from 100 to 1000 parts by weight per 100 parts by weight of the siloxane polymer.

The positive photosensitive siloxane composition of this invention may also contain a heat crosslinking agent. The heat crosslinking agent refers to a compound that crosslinks the siloxane polymer during curing, and if it is contained, the cured film becomes higher in the crosslinking degree. As a result, the hardness and chemical resistance of the cured film are enhanced, and the decline of the pattern resolution due to the melting of fine pattern during curing can be inhibited.

The heat crosslinking agent is not especially limited if it is a compound capable of crosslinking the siloxane polymer during curing, and, for example, can be a compound having two or more reactive groups such as epoxy groups, oxetane groups, vinyl groups, acryl groups, methacryl groups, methylol groups, alkoxymethyl groups or silanol groups. Among these compounds, preferred is a compound having two or more groups respectively represented by the following general formula (2) and/or a compound represented by the following general formula (3).

$$\text{--(CH}_2\text{--O--R}^4\text{)} \quad (2)$$

where $R^4$ denotes a hydrogen atom or alkyl group with 1 to 10 carbon atoms; meanwhile in the general formula (2), plural $R^4$s can be identical with or different from each other.

$$(R^5)_n\text{--Si--(OR}^6)_{4-n} \quad (3)$$

where $R^5$ denotes a hydrogen atom, alkyl group with 1 to 10 carbon atoms, alkenyl group with 2 to 10 carbon atoms or aryl group with 6 to 15 carbon atoms, and plural $R^5$s can be identical with or different from each other; $R^6$ denotes a hydrogen atom, alkyl group with 1 to 6 carbon atoms, acyl group with 2 to 6 carbon atoms or aryl group with 6 to 15 carbon atoms, and plural $R^6$S can be identical with or different from each other; and n denotes an integer of 0 to 2.

In the general formula (2), $R^4$ denotes a hydrogen atom or alkyl group with 1 to 10 carbon atoms. Meanwhile, in the general formula (2), plural $R^4$s can be identical with or different from each other. Examples of the alkyl group include a methyl group, ethyl group, n-propyl group, isopropyl group, n-butyl group, t-butyl group, n-hexyl group and n-decyl group.

Examples of the compound having two or more groups respectively represented by the general formula (2) include the following melamine derivatives and urea derivatives (produced by Sanwa Chemical Co., Ltd.) and phenolic compounds (produced by Honshu Chemical Industry Co., Ltd.).

NIKALAC MW-30HM

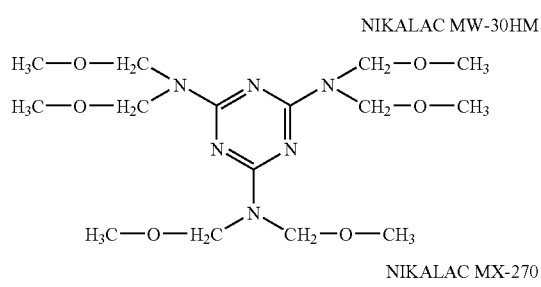

NIKALAC MX-270

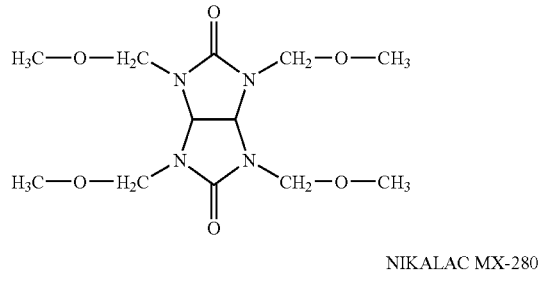

NIKALAC MX-280

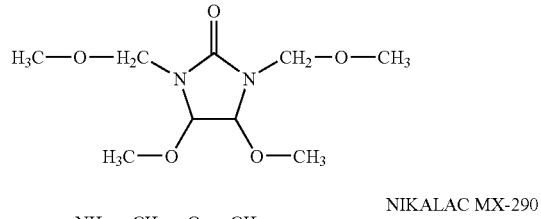

NIKALAC MX-290

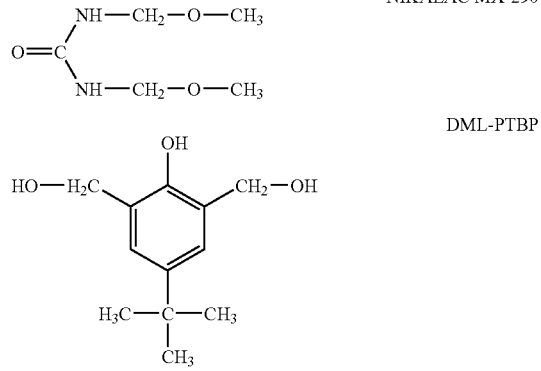

DML-PTBP

DMOM-PTBP

TML-BPA

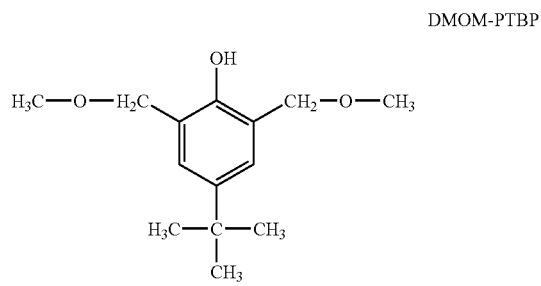

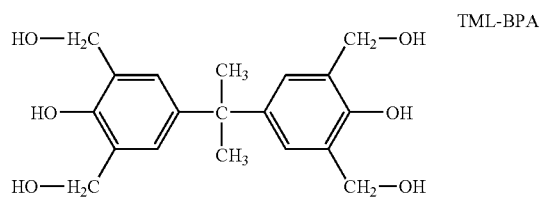

-continued

TMOM-BPA

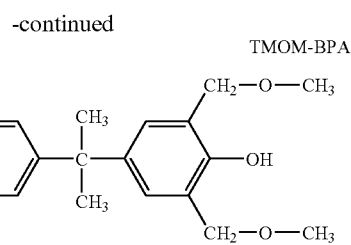

TML-BPAF

TMOM-BPAF

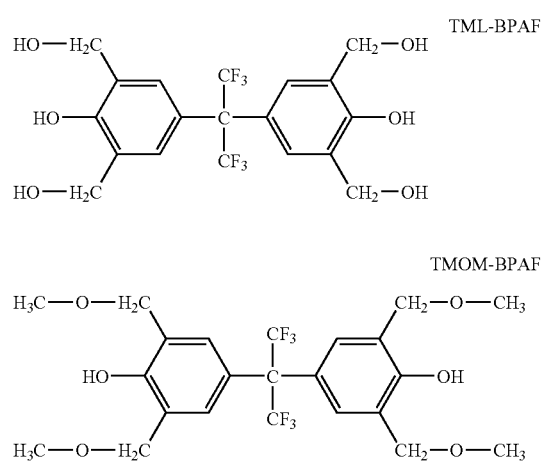

The compound having two or more groups respectively represented by the general formula (2) is effective for not only enhancing the hardness and pattern resolution of the cured film as a heat crosslinking agent but also for contributing to the promotion of dissolution to enhance photosensitivity and to decrease the scum during development. This is a phenomenon especially remarkably observed in a material mainly composed of a siloxane polymer, and the reason is considered to be attributable to the high hydrophobic property of the siloxane polymer. Furthermore, especially in the case where the compound having two or more groups respectively represented by the general formula (2) is used, it is not necessary to newly add, for example, a compound containing a phenolic hydroxyl group likely to lower the transparency, or even if the compound is added, the added amount can be small. So, the transparency peculiar to the siloxane polymer is not impaired, and the obtained cured film can be kept highly transparent. Among these compounds, NIKALAC MX-270 can be especially preferably used, since it has a large effect in promoting dissolution. Any one of the compounds having two or more groups respectively represented by the general formula (2) can be used, or two or more of them can also be used in combination.

In the general formula (3), $R^5$ denotes a hydrogen atom, alkyl group with 1 to 10 carbon atoms, alkenyl group with 2 to 10 carbon atoms or aryl group with 6 to 15 carbon atoms, and plural $R^5$s can be identical with or different from each other. Furthermore, the alkyl group, alkenyl group or aryl group can be either a non-substituted group or a substituted group which can be selected in response to the intended properties of the composition. Examples of the alkyl group include a methyl group, ethyl group, n-propyl group, isopropyl group, n-butyl group, t-butyl group, n-hexyl group, n-decyl group, trifluoromethyl group, 3,3,3-trifluoropropyl group, 3-glycidoxypropyl group, 2-(3,4-epoxycyclohexyl)ethyl group, 3-aminopropyl group, 3-mercaptopropyl group and 3-isocyanatopropyl group. Examples of the alkenyl group include a vinyl group, 3-acryloxypropyl group and 3-methacryloxypropyl group. Examples of the aryl group include a phenyl group, tolyl group, p-hydroxyphenyl group, 1-(p-hydroxyphenyl)ethyl group, 2-(p-hydroxyphenyl)ethyl group, 4-hydroxy-5-(p-hydroxyphenylcarbonyloxy)pentyl group and naphthyl group.

In the general formula (3), $R^6$ denotes a hydrogen atom, alkyl group with 1 to 6 carbon atoms, acyl group with 2 to 6 carbon atoms or aryl group with 6 to 15 carbon atoms, and plural $R^6$s can be identical with or different from each other. Furthermore, the alkyl group, acyl group or aryl group can be either a non-substituted group or a substituted group which can be selected in response to the intended properties of the composition. Examples of the alkyl group include a methyl group, ethyl group, n-propyl group, isopropyl group and n-butyl group. Examples of the acyl group include an acetyl group. Examples of the aryl group include a phenyl group. In the general formula (3), n denotes an integer of 0 to 2.

The examples of the compound represented by the general formula (3) include tetramethoxysilane, tetraethoxysilane, tetraacetoxysilane, tetraphenoxysilane, methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-acryloxypropyltrimethoxysilane, 3-acryloxypropyltriethoxysilane, 3-methacryloxypropyltrimethoxysilane, 3-methacryloxypropyltriethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 3-mercaptopropyltrimethoxysilane, dimethyldimethoxysilane, dimethyldiethoxysilane, dimethyldiacetoxysilane, di-n-butyldimethoxysilane, diphenyldimethoxysilane, (3-glycidoxypropyl)methyldimethoxysilane, (3-glycidoxypropyl)methyldiethoxysilane, etc. Any one of these compounds can be used, or two or more of them can also be used in combination.

The compound represented by the general formula (3) is an organosilane compound, being a compound similar to the organosilane compound of the general formula (4) used as a component of the siloxane polymer. Therefore, it has good compatibility with the siloxane polymer and can keep the cured film highly transparent.

The added amount of the heat crosslinking agent is not especially limited, but it is preferred that the amount is in a range from 0.1 to 10 parts by weight per 100 parts by weight of the siloxane polymer. If the added amount of the heat crosslinking agent is smaller than 0.1 part by weight, the siloxane polymer is insufficiently crosslinked, and the effect is small. On the other hand, if the added amount of the heat crosslinking agent is larger than 10 parts by weight, the colorless transparency of the cured film declines and the storage stability of the composition also declines.

The positive photosensitive siloxane composition of this invention can also contain a crosslinking promoter. The crosslinking promoter refers to a compound that promotes the crosslinking of the siloxane polymer caused by the condensation of the unreactive silanol groups in the polymer occurring during curing. Furthermore, it is a compound that promotes the crosslinking of the siloxane polymer by the reaction between said heat crosslinking agent and the polymer. It improves the hardness and chemical resistance of the cured film and inhibits the decline of pattern resolution due to the melting of fine pattern during curing.

The crosslinking promoter is not especially limited, but a compound capable of generating an acid when heated or exposed to light or a compound capable of generating a base when heated or exposed to light can be preferably used. In the case where a compound capable of generating an acid or base when heated is used, the acid or base is generated in the film during curing to promote the crosslinking of the polymer. On the other hand, in the case where a compound capable of generating an acid or base when exposed to light is used, the acid or base is generated in the film during bleaching exposure before curing, to promote the crosslinking of the polymer.

It is preferred that the compound capable of generating an acid or base when heated is a compound that can generate an acid or base during curing and does not generate or little generates an acid or base during pre-baking after coating with the composition. Therefore, a compound capable of generating an acid at a temperature higher than the pre-baking temperature of the coating film is preferred. The pre-baking temperature is, for example, higher than 100° C., though depending on the composition. If the acid is generated at a temperature lower than the pre-baking temperature, the polysiloxane is likely to be crosslinked during pre-baking, to lower the photosensitivity or to generate scum during development.

The compound capable of generating an acid or base when exposed to light is a compound capable of generating an acid or base during bleaching exposure or a compound capable of generating an acid or base when irradiated with light having an exposure wavelength of 365 nm (i-line), 405 nm (h-line) or 436 nm (g-line) or having these lines mixed. Therefore, also in the pattern exposure using the same light source as that of bleaching exposure, the acid or base may be generated, but since the pattern exposure is small in value compared with bleaching exposure, the amount of the acid or base generated is negligibly small. Furthermore, in the case where a compound capable of generating an acid is used, it is preferred that the generated acid is a strong acid such as a perfluoroalkylsulfonic acid or p-toluenesulfonic acid. A quinonediazide compound capable of generating a carboxylic acid does not have the function of crosslinking the polymer as intended here, and cannot be the crosslinking promoter referred to in this invention.

The compound capable of generating an acid when heated or exposed to light can be an ionic acid generating agent or a nonionic acid generating agent. It is preferred that the ionic acid generating agent does not contain a heavy metal or halogen ion, and a triorganosulfonium salt-based compound can be used. Examples of it include triphenylsulfonium, 1-dimethylthionaphthalene, 1-dimethylthio-4-hydroxynaphthalene, 1-dimethylthio-4,7-dihydroxynaphthalene, 4-hydroxyphenyldimethylsulfonium, 2-methylbenzyl-4-hydroxyphenylmethylsulfonium, 2-methylbenzyl-4-acetylphenylmethylsulfonium, 2-methylbenzyl-4-benzoyloxyphenylmethylsuluonium, their methanesulfonates, trifluoromethanesulfonates, camphorsulfonates and p-tolusnesulfonates. Furthermore, benzylsulfoinium salts such as SI-60, SI-80, SI-100, SI-110, SI-145, SI-150, SI-80L, SI-100L. SI-110L,SI-145L, SI-150, SI-160L and SI-180L (respectively trade names, produced by Sanshin Chemical Industry Co., Ltd. ) can also be used.

The nonionic acid generating agent can be a halogfen-containing compound, diazomethane compounds, sulfone compound, sulfonic ester compound, carboxylic compound, phosphoric ester compound, sulfone imide compound, sulfone benzotriazols compound or the like.

Examples of the haloglen-containing compound include haloalkyl group-containing hyd.rocarbon compounds ainfl haloalkyl group-containling heterocyclic compoundls. Preferred halogen-containing compounds include 1,1-his(4-chlorophenyl)-2,2,2-trichloroethane, 2-phenyl-4,6-bis (trichloromethyl)-s-triazine and 2-naphthyl-4,6-bis (trichloromethyl)-s-triazine.

Examples of the diazomethane compound include bis (trifluorormethylsulfonyl)diazomethane, bis (cyclohexylsulfonyl)diazomethane, bis (phenylsulfonyl)diazomethane, bis (p-tolylsulfonyl)diazomethane, bis (2,4-xylylsulfonyl)diazomethane, bis (p-chlorophenylsulfonyl)diazomethane, methylsulfonyl-p-toluenesulfonyldiazomethane, cyclohexylsulfonyl(1,1-dimethylethylsulfonyl)diazomethane, bis(1,1-dimethylethylsulfonyl)diazomethane and phenylsulfonyl (benzoyl)diazomethane.

Examples of the sulfone compound include β-ketosulfone compounds, β-sulfonylsulfone compounds and diaryldisulfone compounds. Preferred sulfone compounds include 4-triphenacylsulfone, mesitylphenacylsulfone, bis(phenylsulfonyl)methane and 4-chlorophenyl-4-methylphenyldisulfone compounds.

Examples of the sulfonic ester compound include alkylsulfonic esters, haloalkylsulfonic esters, arylsulfonic esters and iminosulfonates. Preferred sulfonic ester compounds include benzoin tosylate, pyrogallol trimesylate, nitrobenzyl-9,10-diethoxyanthracene-2-sulfonate, 2,6-dinitrobenzyl benzene sulfonate, PAI-101 (produced by Midori Kagaku Co., Ltd.), PAI-106 (produced by Midori Kagaku Co., Ltd.), and CGI-1311 (produced by Ciba Specialty Chemicals Co., Ltd.).

Examples of the carboxylic ester compound include o-nitrobenzyl esters of carboxylic acids.

Examples of the sulfone imide compound include N-(trifluoromethylsulfonyloxy)succinimide (SI-105 (produced by Midori Kagaku Co., Ltd.)), N-(camphorsulfonyloxy)succinimide (SI-106 (produced by Midori Kagaku Co., Ltd.)), N-(4-metylphenylsulfonyloxy)succinimide (SI-101 (produced by Midori Kagaku Co., Ltd.)), N-(2-trifluoromethylphenylsulfonyloxy)succinimide, N-(4-fluorophenylsulfonyloxy)succinimide, N-(trifluoromethylsulfonyloxy) phthalimide, N-(camphorsulfonyloxy)phthalimide, N-(2-trifluoromethylphenylsulfonyloxy)phthalimide, N-(2-fluorophenylsulfonyloxy)phthalimide, N-(trifluoromethylsulfonyloxy)diphenylmaleimide (PI-105 (produced by Midori Kagaku Co., Ltd.)), N-(camphorsulfonyloxy)diphenylmaleimide, N-(4-methylphenylsulfonyloxy)diphenylmaleimide, N-(2-trifluoromethylphenylsulfonyloxy)diphenylmaleimide, N-(4-fluorophenylsulfonyloxy)diphenylmaleimide, N-(phenylsulfonyloxy)bicyclo[2.2.1]hepto-5-ene-2,3-dicarboxylimide (NDI-100 (produced by Midori Kagaku Co., Ltd.)), N-(4-methylphenylsulfonyloxy)bicyclo[2.2.1]hepto-5-ene-2,3-dicarboxylimide (NDI-101 (produced by Midori Kagaku Co., Ltd.)), N-(trifluoromethanesulfonyloxy)bicyclo[2.2.1]hepto-5-ene-2,3-dicarboxylimide (NDI-105 (produced by Midori Chemical Co., Ltd.)), N-(nonafluorobutanesulfonyloxy)bicyclo[2.2.1] hepto-5-ene-2,3-dicarboxylimide (NDI-109 (produced by Midori Chemical Co., Ltd.)), N-(camphorsulfonyloxy)bicyclo[2.2.1]hepto-5-ene-2,3-dicarboxylimide (NDI-106 (produced by Midori Kagaku Co., Ltd.)), N-(camphorsulfonyloxy)-7-oxabicyclo[2.2.1]hepto-5-ene-2,3-dicarboxylimide, N-(trifluoromethylsulfonyloxy)-7-oxabicyclo[2.2.1]hepto-5-ene-2,3-dicarboxylimide, N-(4-methylphenylsulfonyloxy) bicyclo[2.2.1]hepto-5-ene-2,3-dicarboxylimide, N-(4-methylphenylsulfonyloxy)-7-oxabicyclo[2.2.1]hepto-5-ene-2,3-dicarboxylimide, N-(2-trifluoromethylphenylsulfonyloxy) bicyclo[2.2.1]hepto-5-ene-2,3-dicarboxylimide, N-(2-trifluoromethylphenylsulfonyloxy)-7-oxabicyclo[2.2.1] hepto-5-ene-2,3-dicarboxylimide, N-(4-fluorophenylsulfonyloxy)bicyclo[2.2.1]hepto-5-ene-2,3-dicarboxylimide, N-(4-fluorophenylsulfonyloxy)-7-oxabicyclo[2.2.1]hepto-5-ene-2,3-dicarboxylimide, N-(trifluoromethylsulfonyloxy)bicyclo[2.2.1]heptane-5,6-oxy-2,3-dicarboxylimide, N-(camphorsulfonyloxy)bicyclo [2.2.1]heptane-5,6-oxy-2,3-dicarboxylimide, N-(4-methylphenylsulfonyloxy)bicyclo[2.2.1]heptane-5,6-oxy-2,3-dicarboxylimide, N-(2-trifluoromethylphenylsulfonyloxy) bicyclo[2.2.1]heptane-5,6-oxy-2,3-dicarboxylimide, N-(4-fluorophenylsulfonyloxy)bicyclo[2.2.1]heptane-5,6-oxy-2, 3-dicarboxylimide, N-(trifluoromethylsulfonyloxy) naphthyldicarboxylimide (NAI-105 (produced by Midori Kagaku Co., Ltd.)), N-(camphorsulfonyloxy)naphthyldicarboxylimide (NAI-106 (Midori Kagaku Co., Ltd.)), N-(4-methylphenylsulfonyoxy)naphthyldicarboxylimide (NAI-101 (produced by Midori Kagaku Co., Ltd.)), N-(phenylsulfonyloxy)naphthyldicarboxylimide (NAI-100 (produced by Midori Kagaku Co., Ltd.)), N-(2-trifluoromethylphenylsulfonyloxy)naphthyldicarboxylimide, N-(4-fluorophenylsulfonyloxy)naphthyldicarboxylimide, N-(pentafluoroethylsulfonyloxy)naphthyldicarboxylimide, N-(heptafluoropropylsulfonyloxy)naphthyldicarboxylimide, N-(nonafluorobutylsulfonyloxy)naphthyldicarboxylimide (NAI-109 (produced by Midori Kagaku Co., Ltd.)), N-(ethylsulfonyloxy)naphthyldicarboxylimide, N-(propylsulfonyloxy)naphthyldicarboxylimide, N-(butylsulfonyloxy)naphthyldicarboxylimide (NAI-1004 (produced by Midori Kagaku Co., Ltd.)), N-(pentylsulfonyloxy)naphthyldicarboxylimide, N-(hexylsulfonyloxy)naphthyldicarboxylimide, N-(heptylsulfonyloxy)naphthyldicarboxylimide, N-(octylsulfonyloxy)naphthyldicarboxylimide and N-(nonylsulfonyloxy)naphthyldicarboxylimide.

Among the above-mentioned acid generating agents, it is desirable that the generated acid is strong for efficiently crosslinking the siloxane polymer. The pka of the acid should be 3 or less. Preferred is 2 or less, and more preferred is 1 or less. In view of the strength of the generated acid, it is preferred that the generated acid is benzenesulfonic acid, alkylbenzenesulfonic acid, perfluoroalkylsulfonic acid, or phosphoric acid. Among them, preferred are sulfonium salts and sulfone imide compounds, since the decline of the pattern resolution can be inhibited without causing reflow during curing.

Examples of the sulfonium salts and sulfone imide compounds include 4-hydroxyphenyldimethylsulfonium, 2-methylbenzyl-4-hydroxyphenylmethylsulfonium, 2-methylbenzyl-4-acetylphenylmethylsulfonium, 2-methylbenzyl-4-benzoyloxyphenylmethylsulfonium, their methanesulfonates, trifluoromethanesulfonates, camphorsulfonates and p-toluenesulfonates. Other examples include SI-60, SI-80, SI-100, SI-110, SI-145, SI-150, SI-80L, SI-100L, SI-110L, SI-145L, SI-150L, SI-160L and SI-180L (trade names, respectively produced by Sanshin Chemical Industry Co., Ltd.), SI-101, SI-105, SI-106, SI-109, PI-105, NDI-101, NDI-105, NDI-109, NAI-101, NAI-105 and NAI-109 (trade names, respectively produced by Midori Kagaku Co., Ltd.).

The compound capable of generating a base when heated or exposed to light is a base generating agent and can be a transition metal complex of cobalt or the like, ortho-nitrobenzyl carbamate, α,α-dimethyl-3,5-dimethoxybenzyl carbamate, or acyloxyimino.

As the base generated by heat or light, either an inorganic base or an organic base can be preferably used. However, in view of generation efficiency, catalytic effect in the crosslinking the siloxane polymer and dissolvability into the siloxane polymer solution, an organic amine is especially preferred. The generated organic amine can be either aliphatic or aromatic, and also either mono-functional or poly-functional. Examples of the generated organic amine include ammonia, methylamine, ethylamine, propylamine, butylamine, hexylamine, cyclohexylamine, decylamine, cetylamine, hydrazine, tetramethylenediamine, hexamethylenediamine, benzylamine, aniline, naphthylamine, phenylenediamine, toluenediamine, diaminodiphenylmethane, hexamethyltetramine, piperidine and piperazine.

As for preferred examples of the base generating agent, examples of the transition metal complex include bromo-pentaammonia cobalt perchlorate, bromo-pentamethylamine cobalt perchlorate, bromo-pentapropylamine cobalt perchlorate, hexaammonia cobalt perchlorate, hexamethylamine cobalt perchlorate and hexapropylamine cobalt perchlorate.

Examples of the ortho-nitrobenzyl carbamate include
[[(2-nitrobenzyl)oxy]carbonyl]methylamine,
[[(2-nitrobenzyl)oxy]carbonyl]propylamine,
[[(2-nitrobenzyl)oxy]carbonyl]hexylamine,
[[(2-nitrobenzyl)oxy]carbonyl]cyclohexylamine,
[[(2-nitrobenzyl)oxy]carbonyl]aniline,
[[(2-nitrobenzyl)oxy]carbonyl]piperidine,
bis[[(2-nitrobenzyl)oxy]carbonyl]hexamethylenediamine,
bis[[(2-nitrobenzyl)oxy]carbonyl]phenylenediamine,
bis[[(2-nitrobenzyl)oxy]carbonyl]toluenediamine,
bis[[(2-nitrobenzyl)oxy]carbonyl]diaminodiphenylmethane,
bis[[(2-nitrobenzyl)oxy]carbonyl]piperazine,
[[(2,6-dinitrobenzyl)oxy]carbonyl]methylamine,
[[(2,6-dinitrobenzyl)oxy]carbonyl]propylamine,
[[(2,6-dinitrobenzyl)oxy]carbonyl]hexylamine,
[[(2,6-dinitrobenzyl)oxy]carbonyl]cyclohexylamine,
[[(2,6-dinitrobenzyl)oxy]carbonyl]aniline,
[[(2,6-dinitrobenzyl)oxy]carbonyl]piperidine,
bis[[(2,6-dinitrobenzyl)oxy]carbonyl]hexamethylenediamine,
bis[[(2,6-dinitrobenzyl)oxy]carbonyl]phenylenediamine,
bis[[(2,6-dinitrobenzyl)oxy]carbonyl]toluenediamine,
bis[[(2,6-dinitrobenzyl)oxy]carbonyl]diaminodiphenylmethane and
bis[[(2,6-dinitrobenzyl)oxy]carbonyl]piperazine.

Examples of the α,α-dimethyl-3,5-dimethoxybenzyl carbamate include
[[(α,α-dimethyl-3,5-dimethoxybenzyl)oxy]carbonyl]methylamine,
[[(α,α-dimethyl-3,5-dimethoxybenzyl)oxy]carbonyl]propylamine,
[[(α,α-dimethyl-3,5-dimethoxybenzyl)oxy]carbonyl]hexylamine,
[[(α,α-dimethyl-3,5-dimethoxybenzyl)oxy]carbonyl]cyclohexylamine,
[[(α,α-dimethyl-3,5-dimethoxybenzyl)oxy]carbonyl]aniline,
[[(α,α-dimethyl-3,5-dimethoxybenzyl)oxy]carbonyl]piperidine,
bis[[(α,α-dimethyl-3,5-dimethoxybenzyl)oxy]carbonyl]hexamethylenediamine,
bis[[(α,α-dimethyl-3,5-dimethoxybenzyl)oxy]carbonyl]phenylenediamine,
bis[[(α,α-dimethyl-3,5-dimethoxybenzyl)oxy]carbonyl]toluenediamine,
bis[[(α,α-dimethyl-3,5-dimethoxybenzyl)oxy]carbonyl]diaminodiphenylmethane and
bis[[(α,α-dimethyl-3,5-dimethoxybenzyl)oxy]carbonyl]piperazine.

Examples of the acyloxyimino include propionyl acetophenone oxime, propionyl benzophenone oxime, propionyl acetone oxime, butyryl acetophenone oxime, butyryl benzophenone oxime, butyryl acetone oxime, adipoyl acetophenone oxime, adipoyl benzophenone oxime, adipoyl acetone oxime, acryloyl acetophenone oxime, acryloyl benzophenone oxime and acryloyl acetone oxime.

As for the above-mentioned base generating agents, it is desirable that the generated base is strong for efficiently crosslinking the siloxane polymer. The pka value of the base should be 11 or more. A preferred value is 12 or more, and a more preferred value is 13 or more. Especially preferred are [[(2-nitrobenzyl)oxy]carbonyl]cyclohexylamine, bis[[(2-nitrobenzyl)oxy]carbonyl]hexamethylenediamine and bis[[(α,α-dimethyl-3,5-dimethoxybenzyl)oxy]carbonyl]hexamethylenediamine.

Any one of the crosslinking promoters can be used, or two or more of them can also be used in combination.

The added amount of the crosslinking promoter is not especially limited, but it is preferred that the amount is in a range from 0.01 to 5 parts by weight per 100 parts by weight of the siloxane polymer. If the added amount is smaller than 0.01 part by weight, the effect is not sufficient, and if it is larger than 5 parts by weight, the crosslinking of the siloxane polymer occurs during pre-baking and during pattern exposure.

The photosensitive siloxane composition of this invention can also contain a sensitizer. The contained sensitizer promotes the reaction of the naphthoquinonediazide compound used as a photosensitive material, to enhance the photosensitivity. Furthermore, in the case where a compound capable of generating an acid or base when exposed to light is contained as the crosslinking promoter, the reaction during bleaching exposure is provided to improve the hardness and chemical resistance of the cured film. Moreover, the decline of the pattern resolution due to the melting of fine pattern during curing is inhibited.

The sensitizer used in this invention is not especially limited, but it is preferred to use a sensitizer that can be vaporized when heat-treated and/or can fade when irradiated with light. Usually the sensitizer can absorb light with wavelengths of 365 nm (i-line), 405 nm (h-line) and 436 nm (g-line) corresponding to the wavelengths of the light source used for pattern exposure and bleaching exposure. However, since a general sensitizer exists in the cured film after completion of exposure and development, it absorbs the light of visible region, to lower the colorless transparency. On the other hand, since the sensitizer used in this invention is a compound capable of being vaporized when heat-treated for curing and/or a compound fading when irradiated with light for bleaching exposure, it does not exist in the cured film. Even if it exists in the cured film, the colorless transparency of the cured film does not decline since the sensitizer does not absorb the light of visible region.

Examples of the sensitizer capable of being vaporized when heat-treated and/or capable of fading when irradiated with light include coumarins such as 3,3-carbonylbis(diethylaminocoumarin), anthraquinones such as 9,10-anthraquinone, aromatic ketones such as benzophenone, 4,4'-dimethoxybenzophenone, acetophenone, 4-methoxyacetophenone and benzaldehyde, and condensed aromatic compounds such as biphenyl, 1,4-dimethylnaphthalene, 9-fluorenone, fluorenone, phenanthrene, triphenylene, pyrene, anthracene, 9-phenylanthracene, 9-methoxyanthracene, 9,10-diphenylanthracene, 9,10-bis(4-methoxyphenyl)anthracene, 9,10-bis(triphenylsilyl)anthracene, 9,10-dimethoxyanthracene, 9,10-diethoxyanthracene, 9,10-dipropoxyanthracene, 9,10-dibutoxyanthracene, 9,10-dipentaoxyanthracene, 2-t-butyl-9,10-dibutoxyanthracene and 9,10-bis(trimethylsilylethynyl)anthracene.

Among these sensitizers, it is preferred that the sensitizer capable of being volatilized when heat-treated is a sensitizer from which the thermal decomposition product formed due to sublimation, evaporation or thermal decomposition by heat treatment is sublimed or evaporated. Furthermore, it is preferred that the vaporizing temperature of the sensitizer is from 130 to 400° C. A more preferred range is from 150 to 250° C. If the vaporizing temperature of the sensitizer is lower than 130° C., it can happen that the sensitizer is vaporized during pre-baking and does not exist in the exposure process, not allowing the photosensitivity to be enhanced. Furthermore, to inhibit the vaporization during pre-baking as far as possible, it is preferred that the vaporizing temperature of the sensitizer is 150° C. or higher. On the other hand, if the vaporizing temperature of the sensitizer is higher than 400° C., it can happen that the sensitizer remains in the cured film without being vaporized during curing, to lower the colorless transparency. Moreover, for perfect vaporization during curing, it is preferred that the vaporizing temperature of the sensitizer is lower than 250° C.

On the other hand, it is preferred in view of transparency that the sensitizer capable of fading when irradiated with light is a sensitizer in which the absorption of light in the visible region fades due to irradiation with light. Furthermore, a more preferred compound capable of fading when irradiated with light is a compound capable of being dimerized when irradiated with light. Since the compound dimerized when irradiated with light increases in molecular weight, for being insolubilized, such effects as improvement of chemical resistance, improvement of heat resistance and the decrease of extract from the cured transparent film can be obtained.

In view of the possibility of achieving high photosensitivity and the possibility of being dimerized to fade when irradiated with light, it is preferred that the sensitizer is an anthracene-based compound. More preferred is a 9,10-disubstituted anthracene-based compound. It is not easy to use an anthracene-based compound having hydrogen atoms at the 9- and 10-positions, since the compound is unstable to heat. Moreover, in view of higher solubility of the sensitizer and the reactivity in photo-dimerization reaction, a 9,10-dialkoxyanthracene-based compound represented by the following general formula (6) is preferred.

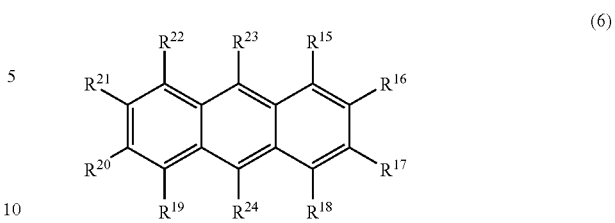

where $R^{15}$, $R^{16}$, $R^{17}$, $R^{18}$, $R^{19}$, $R^{20}$, $R^{21}$ and $R^{22}$ denote, respectively independently, a hydrogen atom, alkyl group with 1 to 20 carbon atoms, alkoxy group, alkenyl group, ethynyl group, aryl group, acyl group or an organic-group obtained by substituting any of these groups; $R^{23}$ and $R^{24}$ denotes, respectively independently, an alkoxy group with 1 to 20 carbon atoms or an organic group obtained by substituting the alkoxy group.

In the general formula (6), $R^{15}$ through $R^{22}$ denote, respectively independently, a hydrogen atom, alkyl group with 1 to 20 carbon atoms, alkoxy group, alkenyl group, aryl group, acyl group, or an organic group obtained by substituting any of these groups. Examples of the alkyl group include a methyl group, ethyl group and n-propyl group. Examples of the alkoxy group include a methoxy group, ethoxy group, propoxy group, butoxy group and pentyloxy group. Examples of the alkenyl group include a vinyl group, acryloxypropyl group and methacryloxypropyl group. Examples of the aryl group include a phenyl group, tolyl group and naphthyl group. Examples of the acyl group include an acetyl group. In view of the volatility of the compound and the reactivity in photo dimerization, it is preferred that $R^{15}$ through $R^{22}$ denote, respectively independently, a hydrogen atom or organic group with 1 to 6 carbon atoms. It is more preferred that $R^{15}$, $R^{18}$, $R^{19}$ and $R^{22}$ denote a hydrogen atom respectively.

In the general formula (6), $R^{23}$ and $R^{24}$ denote, respectively independently, an alkoxy group with 1 to 20 carbon atoms or an organic group obtained by substituting the alkoxy group. Examples of the alkoxy group include a methoxy group, ethoxy group, propoxy group, butoxy group and pentyloxy group. However, in view of the dissolvability of the compound and the fading reaction due to photo dimerization, a propoxy group and a butoxy group are preferred.

It is preferred that the added amount of the sensitizer is in a range from 0.01 to 5 parts by weight per 100 parts by weight of the siloxane polymer. If the amount is not in this range, it can happen that the transparency or photosensitivity declines.

The positive photosensitive siloxane compound of this invention can also contain, as required, additives such as solubility enhancer, dissolution inhibitor, surfactant, stabilizer and defoaming agent.

Especially a solubility enhancer can enhance the photosensitivity. As the solubility enhancer, a compound having a phenolic hydroxyl group or an N-hydroxydicarboxyimide compound can be preferably used. Examples of it include those enumerated for the compound having a phenolic hydroxyl group used in the quinonediazide compound.

The method for forming a cured film using the positive photosensitive siloxane composition of this invention is explained below. A substrate is coated with the positive photosensitive siloxane compound of this invention using a publicly known method such as a spinner, dipping or slit, and the coating film is pre-baked using a heater such as a hot plate or oven. The pre-baking is performed in a range from 50 to 150° C. for 30 seconds to 30 minutes, and it is preferred that the film thickness after completion of pre-baking is in a range from 0.1 to 15 μm.

After completion of pre-baking, a machine for exposing to the light of ultraviolet and visible region such as a stepper, mirror projection mask aligner (MPA) or parallel light mask aligner (PLA) is used for exposure through a desired mask at about 10 to about 4000 J/m$^2$ (in terms of wavelength 365 nm exposure energy value).

After completion of exposure, the exposed area can be dissolved by development, to obtain a positive pattern. As for the developing method, it is preferred to immerse the coated substrate in a developing solution for 5 seconds to 10 minutes using such a method as showering, dipping or paddling. As the developing solution, a publicly known alkaline developing solution can be used. The developing solution can be, for example, an aqueous solution containing one or more of inorganic alkalis such as alkali metal hydroxides, carbonates, phosphates, silicates and borates, amines such as 2-diethylaminoethanol, monoethanolamine and diethanolamine, and quaternary ammonium salts such as tetramethylammonium hydroxide and choline.

After completion of development, it is preferred to rinse using water. Furthermore, if necessary, a heater such as a hot plate or oven can also be used for baking and drying in a range from 50 to 150° C.

Then, it is preferred to perform bleaching exposure. If bleaching exposure is performed, the unreactive quinonediazide compound remaining in the film is photo-decomposed to further improve the optical transparency of the film. As the bleaching exposure method, a machine for exposing to the light of ultraviolet and visible region such as PLA is used for exposing the entire surface at about 100 to about 20000 J/m$^2$ (in terms of wavelength 365 nm exposure energy value).

After completion of bleaching exposure, if necessary, the film is soft-baked using a heater such as a hot plate or oven in a range from 50 to 150° C., and is cured using a heater such as a hot plate or oven in a range from 150 to 450° C. for about 1 hour, to form a cured film such as a planarization film for TFT of a display element, an interlayer dielectrics of a semiconductor element or a core or cladding of an optical waveguide.

The element in this invention refers to a display element, semiconductor element or optical waveguide respectively having a cured film with high transparency, high heat resistance and low dielectric constant as described before. Especially for a liquid crystal display element or an organic EL display element having a planarization film for TFT, the cured film of this invention can be effectively used since it is excellent in screen brightness and reliability.

EXAMPLES

This invention is described below more particularly in reference to examples, but is not limited thereto or thereby. The phenyl group content based on the amount of Si atoms was obtained by $^{29}$Si-NMR measurement. The phenolic hydroxyl group content based on the amount of Si atoms was obtained by $^{29}$Si-NMR measurement and $^1$H-NMR measurement. The weight average molecular weight (Mw) of a polymer was obtained in terms of polystyrene using GPC (solvent: tetrahydrofuran).

Synthesis Example 1

Synthesis of Siloxane Polymer Solution (a)

A 500 mL three-neck flask was charged with 88.53 g (0.65 mole) of methyltrimethoxysilane, 69.41 g (0.35 mole) of phenyltrimethoxysilane and 138.87 g of diacetone alcohol (DAA), and with stirring at room temperature, a phosphoric acid aqueous solution with 0.158 g (0.1 wt % based on the weight of supplied monomers) of phosphoric acid dissolved in 54 g of water was added, taking 30 minutes. Then, the flask was immersed in a 40° C. oil bath while the solution was stirred for 30 minutes, and the oil bath was heated up to 115° C., taking 30 minutes. One hour after start of heating, the inner temperature of the solution reached 100° C., and the solution was heated and stirred for further 2 hours (the inner temperature of the solution in the duration was 100 to 110° C.). During the reaction, 120 g in total of methanol and water were distilled out as byproducts. To the obtained siloxane polymer DAA solution, DAA and y-butyrolactone (GBL) were added to achieve a polymer concentration of 35 wt % and a DAA/GBL solvent ratio of 90/10, for obtaining a siloxane polymer solution (a). The phenolic hydroxyl group content based on the amount of Si atoms was 0%, and the phenyl group content was 35 mol %. Furthermore, the weight average molecular weight (Mw) of the obtained polymer was 3700.

Synthesis Example 2

Synthesis of Siloxane Polymer Solution (b)

A 500 mL three-neck flask was charged with 68.1 g (0.5 mole) of methyltrimethoxysilane, 59.49 g (0.3 mole) of phenyltrimethoxysilane, 14.83 g (0.2 mole in the number of silane atom-moles) of DMS-S12 as a straight chain polysiloxane (produced by Gelest Inc.) and 130.73 g of DAA, and with stirring at room temperature, a phosphoric acid aqueous solution with 0.142 g (0.1 wt % based on the weight of supplied monomers) dissolved in 43.2 g of water was added, taking 30 minutes. Then, the flask was immersed in a 40° C. oil bath while the solution was stirred for 30 minutes, and the oil bath was heated up to 115° C., taking 30 minutes. One hour after start of heating, the inner temperature of the solution reached 100° C., and the solution was heated and stirred for further 3 hours (the inner temperature of the solution in the duration was 100 to 110° C.). During the reaction, 97 g in total of methanol and water were distilled out as byproducts. To the obtained siloxane polymer DAA solution, DAA and GBL were added to achieve a polymer concentration of 35 wt % and a DAA/GBL solvent ratio of 80/20, for obtaining a siloxane polymer solution (b). The phenolic hydroxyl group content based on the amount of Si atoms was 0%, and the phenyl group content was 30 mol %. Furthermore, the weight average molecular weight (Mw) of the obtained polymer was 5300.

Synthesis Example 3

Synthesis of Siloxane Polymer Solution (c)

A 500 mL three-neck flask was charged with 81.72 g (0.6 mole) of methyltrimethoxysilane, 59.49 g (0.3 mole) of phenyltrimethoxysilane, 34.44 g (0.1 mole) of 4-hydroxy-5-(p-hydroxyphenylcarbonyloxy)pentyltrimethoxysilane and 160.51 g of DAA, and with stirring at room temperature, a phosphoric acid aqueous solution with 0.176 g (0.1 wt % based on the weight of supplied monomers) dissolved in 54 g of water was added, taking 30 minutes. Then, the flask was immersed in a 40° C. oil bath while the solution was stirred for 30 minutes, and the oil bath was heated up to 115° C., taking 30 minutes. One hour after start of heating, the inner temperature of the solution reached 100° C., and the solution was heated and stirred for further 2.5 hours (the inner temperature of the solution in the duration was 100 to 110° C.). During the reaction, 120 g in total of methanol and water were distilled out as byproducts. To the obtained siloxane polymer DAA solution, DAA and GBL were added to achieve a polymer concentration of 35 wt % and a DAA/GBL solvent ratio of 90/10, for obtaining a siloxane polymer solution (c). The phenolic hydroxyl group content based on the amount of Si atoms was 10 mol %, and the phenyl group content was 40 mol %. Furthermore, the weight average molecular weight (Mw) of the obtained polymer was 7000. Meanwhile, the 4-hydroxy-5-(p-hydroxyphenylcarbonyloxy)pentyltrimethoxysilane is a phenolic hydroxyl group-containing organosilane having the following structure.

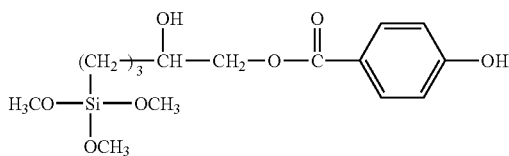

Synthesis Example 4

Synthesis of Siloxane Polymer Solution (d)

A 500 mL three-neck flask was charged with 81.72 g (0.6 mole) of methyltrimethoxysilane, 19.83 g (0.1 mole) of phenyltrimethoxysilane, 103.33 g (0.3 mole) of 4-hydroxy-5-(p-hydroxyphenylcarbonyloxy)pentyltrimethoxysilane and 196.2 g of DAA, and with stirring at room temperature, a phosphoric acid aqueous solution with 0.205 g (0.1 wt % based on the supplied monomers) of phosphoric acid dissolved in 54 g of water was added, taking 30 minutes. Then, the flask was immersed in a 40° C. oil bath while the solution was stirred for 30 minutes, and the oil bath was heated up to 115° C., taking 30 minutes. One hour after start of heating, the inner temperature of the solution reached 100° C., and the solution was heated and stirred for further 2.5 hours (the inner temperature of the solution in the duration was 100 to 110° C.). During the reaction, 120 g in total of methanol and water were distilled out as byproducts. To the obtained siloxane polymer DAA solution, DAA and GBL were added to achieve a polymer concentration of 35 wt % and a DAA/GBL solvent ratio of 90/10, for obtaining a siloxane polymer solution (d). Meanwhile, the phenolic hydroxyl group content based on the amount of Si atoms was 30 mol %, and the phenyl group content was 40 mol %. Furthermore, the weight average molecular weight (Mw) of the obtained polymer was 8500.

Synthesis Example 5

Synthesis of Siloxane Polymer Solution (e)

A 500 mL three-neck flask was charged with 81.72 g (0.6 mole) of methyltrimethoxysilane, 79.32 g (0.4 mole) of phenyltrimethoxysilane and 142.67 g of 3-methoxy-1-butanol (MB), and with stirring at room temperature, a phosphoric acid aqueous solution with 0.161 g (0.1 wt % based on the supplied monomers) of phosphoric acid dissolved in 54 g of water was added, taking 30 minutes. Then, the flask was immersed in a 40° C. oil bath while the solution was stirred for 30 minutes, and the oil bath was heated up to 115° C., taking 30 minutes. One hour after start of heating, the inner temperature of the solution reached 100° C., and the solution was heated and stirred for further 4 hours (the inner temperature of the solution in the duration was 100 to 110° C.). During the reaction, 120 g in total of methanol and water were distilled out as byproducts. To the obtained siloxane polymer MB solution, MB and GBL were added to achieve a polymer concentration of 35% and an MB/GBL solvent ratio of 70/30, for obtaining a siloxane polymer solution (e). Meanwhile, the phenolic hydroxyl group content based on the amount of Si atoms was 0%, and the phenyl group content based on the amount of Si atoms was 40 mol %. Furthermore, the weight average molecular weight (Mw) of the obtained polymer was 5500.

Synthesis Example 6

Synthesis of Siloxane Polymer Solution (f)

A 500 mL three-neck flask was charged with 95.34 g (0.55 mole) of methyltrimethoxysilane, 59.49 g (0.45 mole) of phenyltrimethoxysilane and 135.08 g of DAA, and with stirring at room temperature, a phosphoric acid aqueous solution with 0.155 g (0.1 wt % based on the supplied monomers) of phosphoric acid added to 54 g of water was added, taking 30 minutes. Then, the flask was immersed in a 40° C. oil bath while the solution was stirred for 30 minutes, and the oil bath was heated up to 115° C., taking 30 minutes. One hour after start of heating, the inner temperature of the solution reached 100° C., and the solution was heated and stirred for further 2 hours (the inner temperature of the solution in the duration was 100 to 110° C.). During the reaction, 120 g in total of methanol and water were distilled out as byproducts. To the obtained siloxane polymer DAA solution, DAA was added to achieve a polymer concentration of 35 wt % and to contain DAA only as the solvent, for obtaining a siloxane polymer solution (f). Meanwhile, the phenolic hydroxyl group content based on the amount of Si atoms was 0%, and the phenyl group content based on the amount of Si atoms was 45 mol %. Furthermore, the weight average molecular weight (Mw) of the obtained polymer was 4500.

Synthesis Example 7

Synthesis of Siloxane Polymer Solution (g)

A 500 mL three-neck flask was charged with 88.53 g (0.65 mole) of methyltrimethoxysilane, 69.41 g (0.35 mole) of phenyltrimethoxysilane and 138.87 g of diisobutyl ketone (DIBK), and with stirring at room temperature, a phosphoric acid aqueous solution with 0.158 g (0.1 wt % based on the weight of the supplied monomers) of phosphoric acid dissolved in 54 g of water was added, taking 30 minutes. Then, the flask was immersed in a 40° C. oil bath while the solution was stirred for 30 minutes, and the oil bath was heated up to 115° C., taking 30 minutes. One hour after start of heating, the inner temperature of the solution reached 100° C., and the solution was heated and stirred for further 2 hours (the inner temperature of the solution in the duration was 100 to 110° C.) During the reaction, 120 g in total of methanol and water were distilled out as byproducts. To the obtained siloxane polymer DIBK solution, DIBK was added to achieve a polymer concentration of 35 wt % and to contain DIBK only as the solvent, for obtaining a siloxane polymer solution (g). Meanwhile, the phenolic hydroxyl group content based on the amount of Si atoms was 0%, and the phenyl group content based on the amount of Si atoms was 35 mol %. Furthermore, the weight average molecular weight (Mw) of the obtained polymer was 5000.

Synthesis Example 8

Synthesis of Acrylic Polymer Solution (h)

A 500 mL three-neck flask was charged with 5 g of 2,2'-azobis(2,4-dimethylvaleronitrile) and 200 g of diethylene glycol ethyl methyl ether (EDM). In succession, 25 g of styrene, 20 g of methacrylic acid, 45 g of glycidyl methacrylate and 10 g of tricycle[5.2.1.0$^{2,6}$]decane-8-yl methacrylate were added. The mixture was stirred at room temperature for a while, and the atmosphere in the flask was replaced by nitrogen. Then, the flask was immersed in a 70° C. oil bath, and the solution was heated and stirred for 5 hours. To the obtained acrylic polymer EDM solution, EDM was added to achieve a polymer concentration of 30 wt % and to contain EDM only as the solvent, for obtaining an acrylic polymer solution (h). Meanwhile, the weight average molecular weight (Mw) of the obtained polymer was 15000.

Synthesis Example 9

Synthesis of Quinonediazide Compound (a)

In a dry nitrogen stream, 21.23 g (0.05 mole) of Tris P-PA (trade name, produced by Honshu Chemical Industry Co., Ltd.) and 37.62 g (0.14 mole) of 5-naphthoquinonediazidesulfonylic acid chloride were dissolved into 450 g of 1,4-dioxane, and the solution was kept at room temperature. To the solution, 15.58 g (0.154 mole) of triethylamine mixed with 50 g of 1,4-dioxane was added dropwise, while the inner temperature of the solution was kept at lower than 35° C. After completion of dropwise addition, the solution was stirred at 30° C. for 2 hours. The triethylamine salt was removed by filtration, and the filtrate was added into water. Then, the precipitate formed was collected by filtration and dried in a vacuum dryer, to obtain a quinonediazide compound (a) with the following structure.

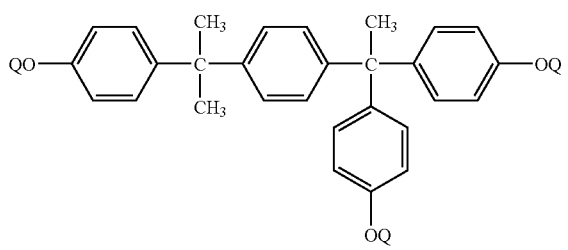

-continued

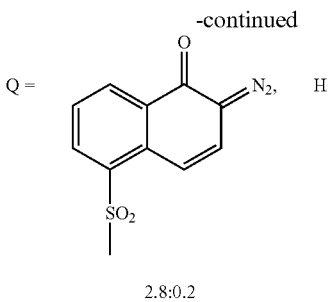

2.8:0.2

Synthesis Example 10

Synthesis of Quinonediazide Compound (b)

In a dry nitrogen stream, 15.32 g (0.05 mole) of TrisP-HAP (trade name, produced by Honshu Chemical Industry Co., Ltd.) and 22.84 g (0.085 mole) of 5-naphthoquinonediazidesulfonylic acid chloride were dissolved into 450 g of 1,4-dixane, and the solution was kept at room temperature. To the solution, 9.46 g (0.0935 mole) of triethylamine mixed with 50 g of 1,4-dioxane was added dropwise while the inner temperature of the solution was kept at lower than 35° C. After completion of dropwise addition, the solution was stirred at 30° C. for 2 hours. The triethylamine salt was removed by filtration, and the filtrate was added into water. Then, the formed precipitate was collected by filtration and dried in a vacuum dryer, to obtain a quinonediazide compound (b) with the following structure.

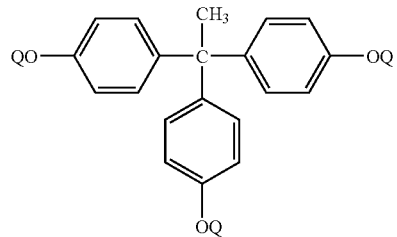

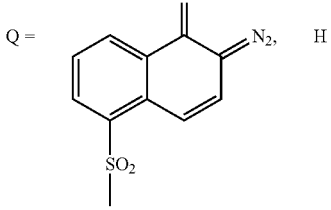

1.7:1.3

Synthesis Example 11

Synthesis of Quinonediazide Compound (c)

In a dry nitrogen stream, 14.52 g (0.05 mole) of BisP-AP (trade name, produced by Honshu Chemical Industry Co., Ltd.) and 26.87 g (0.1 mole) of 5-naphthoquinonediazidesulfonylic acid chloride were dissolved into 450 g of 1,4-dioxane, and the solution was kept at room temperature. To the solution, 11.13 g (0.11 mole) of triethylamine mixed with 50 g of 1,4-dioxane was added dropwise, while the inner temperature of the solution was kept at lower than 35° C. After completion of dropwise addition, the solution was stirred at 30° C. for 2 hours. The triethylamine salt was removed by filtration, and the filtrate was added into water. Then, the formed precipitate was collected by filtration and dried in a vacuum dryer, to obtain a quinonediazide compound (c) with the following structure.

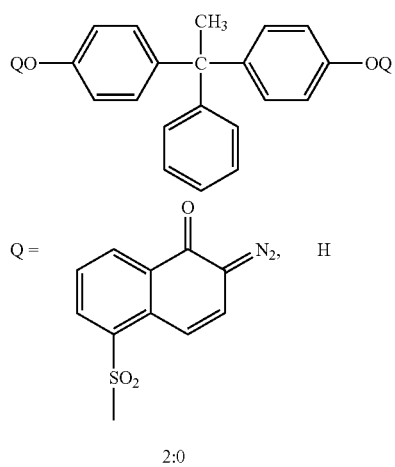

2:0

Synthesis Example 12

Synthesis of Quinonediazide Compound (d)

In a dry nitrogen stream, 17.42 g (0.05 mole) of TrisOC-HAP (trade name, produced by Honshu Chemical Industry Co., Ltd.) and 26.87 g (0.1 mole) of 5-naphthoquinonediazidesulfonylic acid chloride were dissolved into 450 g of 1,4-dioxane, and the solution was kept at room temperature. To the solution, 11.13 g (0.11 mole) of triethylamine mixed with 50 g of 1,4-dioxane was added dropwise, while the inner temperature of the solution was kept at lower than 35° C. After completion of dropwise addition, the solution was stirred at 30° C. for 2 hours. The triethylamine salt was removed by filtration, and the filtrate was added into water. Then, the formed precipitate was collected by filtration and dried in a vacuum dryer, to obtain a quinonediazide compound (d) with the following structure.

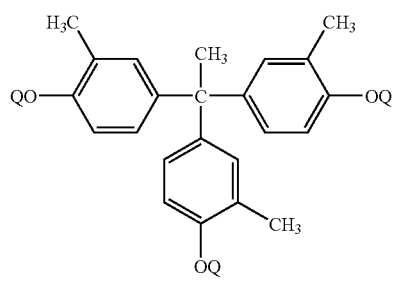

-continued

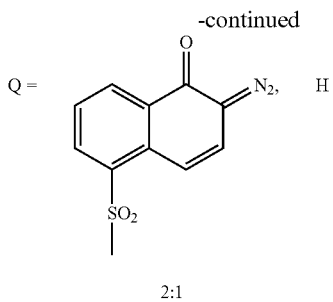

2:1

Synthesis Example 13

Synthesis of Quinonediazide Compound (e)

In a dry nitrogen stream, 21.23 g (0.05 mole) of TrisP-PA (trade name, produced by Honshu Chemical Industry Co., Ltd.) and 26.87 g (0.1 mole) of 5-naphthoquinonediazidesulfonylic acid chloride were dissolved into 450 g of 1,4-dioxane, and the solution was kept at room temperature. To the solution, 11.13 g (0.11 mole) of triethylamine mixed with 50 g of 1,4-dioxane was added dropwise, while the inner temperature of the solution was kept at lower than 35° C. After completion of dropwise addition, the solution was stirred at 30° C. for 2 hours. The triethylamine salt was removed by filtration, and the filtrate was added into water. Then, the formed precipitate was collected by filtration and dried in a vacuum drier, to obtain a quinonediazide compound (e) with the following structure.

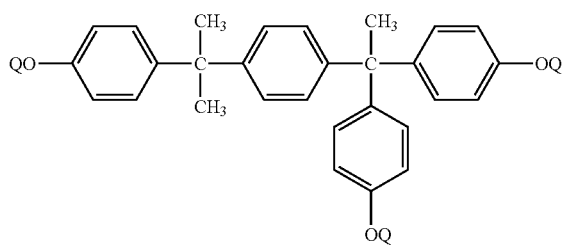

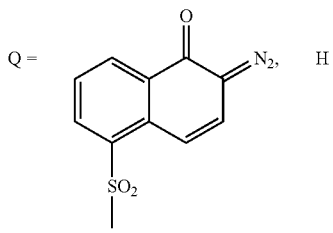

2:1

Working Example 1

Thirty grams of the siloxane polymer solution (a) of Synthesis Example 1, 0.3 g of the quinonediazide compound (a) of Synthesis Example 9 and 0.2 g of TrisP-PA (produced by Honshu Chemical Industry Co., Ltd.) as a solubility enhancer were mixed and stirred under a yellow lamp, to obtain a homogeneous solution, and it was collected by a 0.2 μm filter, to obtain a composition 1.

A Tempax glass sheet (produced by Asahi Techno Glass Corporation) or a silicon wafer was coated with the composition 1 using a spin coater (1H-360S produced by Mikasa Co., Ltd.) at a given rotating speed, and a hot plate (SCW-636 produced by Dainippon Screen Mfg. Co., Ltd.) was used for pre-baking at 100° C. for 2 minutes, to form a 4 μm thick film. The formed film was exposed through a gray scale mask for photosensitivity measurement to an ultra high pressure mercury lamp using a parallel light mask aligner (hereinafter called PLA, PLA-501F produced by Canon Inc.), and developed with a shower of 2.38 wt % tetramethylammonium hydroxide aqueous solution (ELM-D, produced by Mitsubishi Gas Chemical Co., Inc.) for 80 seconds using an automatic processing machine (AD-2000 produced by Takizawa Sangyo Co., Ltd.), then being rinsed with water for 30 seconds. Subsequently as bleaching exposure, a PLA (PLA-501F produced by Canon Inc.) was used to expose the entire film surface to an ultra high pressure mercury lamp at 6000 J/m$^2$ (in terms of wavelength 365 nm exposure energy value). Then, a hot plate was used for soft baking at 90° C. for 2 minutes, and an oven (1HPS-222 produced by Tabai Espec Corp.) was used for curing at 250° C. in air for 1 hour, to form a cured film.

The results of Working Example 1 are shown in Tables 4 and 6. The properties in the tables were evaluated according to the following methods. The following items (1), (2), (3), (4) and (8) were evaluated using the silicon wafer as the substrate, and items (6) and (9) were evaluated using the Tempax glass sheet.

(1) Measurement of Film Thickness

RamdaA STM-602 produced by Dainippon Screen Mfg. Co., Ltd. was used to measure the thickness at a refractive index of 1.50.

(2) Normalized Remaining Film Thickness after Development

The normalized remaining film thickness was calculated from the following equation.

Normalized remaining film thickness after development (%)=Film thickness of non-exposed area after development÷Film thickness after pre-baking×100

(3) Photosensitivity

After completion of exposure and development, the exposure energy value at which a 10 μm line and space pattern could be resolved at a width ratio of 1:1 (hereinafter called the optimum exposure energy value) was identified as the photosensitivity.

(4) Resolution of the Cured Film

The minimum pattern size at the optimum exposure energy value after curing was identified as the resolution of the cured film.

(5) Weight Loss Ratio

About 100 mg of a composition was placed in an aluminum cell, and thermogravimetric apparatus TGA-50 (produced by Shimadzu Corporation) was used to heat at a heating rate of 10° C./min up to 300° C. in nitrogen atmosphere, to heat at the temperature for 1 hour for curing, and then to heat at a heating rate of 10° C./min up to 400° C., for calculating the weight loss ratio. The composition was weighed when 300° C. was reached, and further weighed when 400° C. was reached. The difference between the weights was obtained as the weight decrement that was identified as the weight loss ratio.

(6) Measurement of Light Transmittance

MultiSpec-1500 (produced by Shimadzu Corporation) was used to measure the absorption spectrum of the Tempax glass sheet only in the ultraviolet and visible light region as the reference. Then, a cured film was formed on the Tempax glass sheet as a sample, and the sample was measured using a single beam for obtaining the light transmittance per 3 μm at a wavelength of 400 nm. The difference between the light transmittance and the reference was obtained as the light transmittance of the cured film.

(7) Measurement of Dielectric Constant

An aluminum substrate was coated with a composition, and it was pre-baked, exposed and cured to form a thin film. Then, on the thin film, an aluminum electrode was formed and the electrostatic capacity at 1 kHz was measured using LCR Meter 4284A produced by Agilent Technologies Japan, Ltd. The dielectric constant ($\epsilon$) was obtained from the following equation. No development treatment was performed.

$$\epsilon = C \cdot d / \epsilon_0 \cdot S$$

where C is the electrostatic capacity; d is the sample film thickness; $\epsilon_0$ is the dielectric constant in vacuum; and S is the area of the top electrode.

(8) Pencil Hardness

Pencils different in lead hardness were sharpened at their lead using sand paper, and used to scratch the film. The hardest pencil hardness at which the film was not broken was identified as the pencil hardness of the film.

(9) Measurement of Chromaticity Coordinates (x, y)

After a cured film was formed on a Tempax glass sheet, a microspectrophotometer (MCPD-2000 produced by Otsuka Electronics Co., Ltd.) was used to measure the transmission spectrum. From the obtained spectrum, the reference stimuli X, Y and Z with light source C were calculated, to obtain the chromaticity coordinates (x, y)

Working Examples 2 to 22 and Comparative Examples 1 to 5

According to the recipes stated in Tables 1 to 3, compositions 2 to 27 were prepared as described for the composition 1. The NIKALAC MX-270 (produced by Sanwa Chemical Co., Ltd.), TML-BPAF (produced by Honshu Chemical Industry Co., Ltd.), EPIKOTE 828 (produced by Japan Epoxy Resins Co., Ltd.) and DMOM-PTBT (produced by Sanwa Chemical Co., Ltd.) respectively used as heat crosslinking agents, NAI-105, NAI-109, NDI-105 and NDI-109 (respectively produced by Midori Kagaku Co., Ltd.) respectively used as crosslinking promoters, DBA and DPA (respectively produced by Kawasaki Kasei Chemicals Ltd.) respectively used as sensitizers, Tris P-PA, Tris P-HAP, Bis P-PR, Bis P-AP and Bis P-FL (respectively produced by Honshu Chemical Industry Co., Ltd.) respectively used as solubility enhancer were the compounds with the following structures.

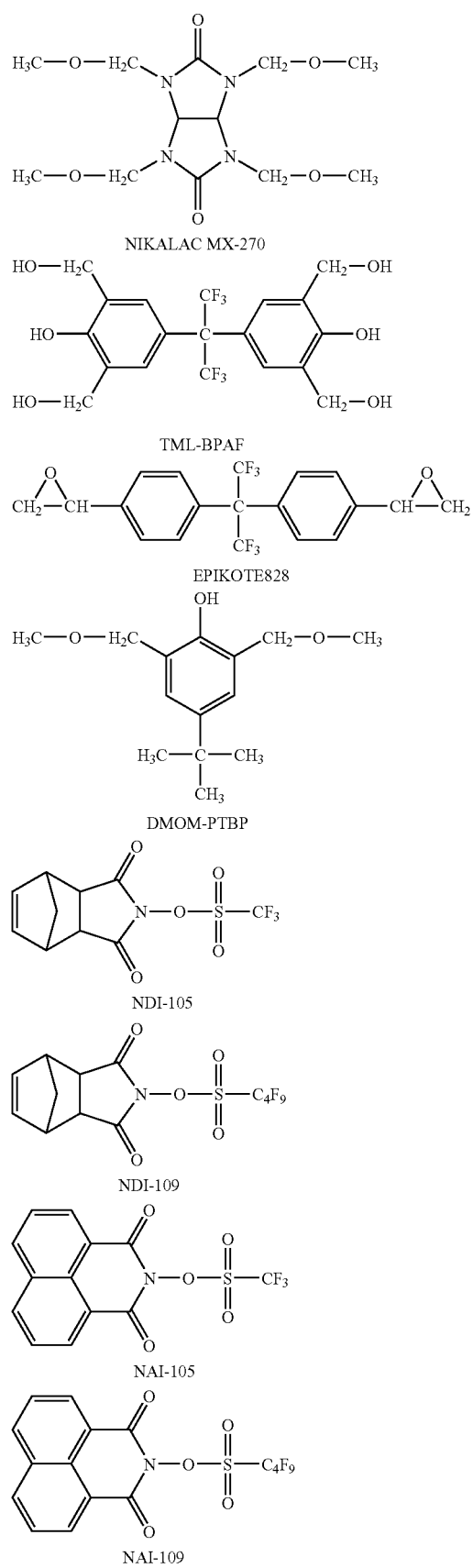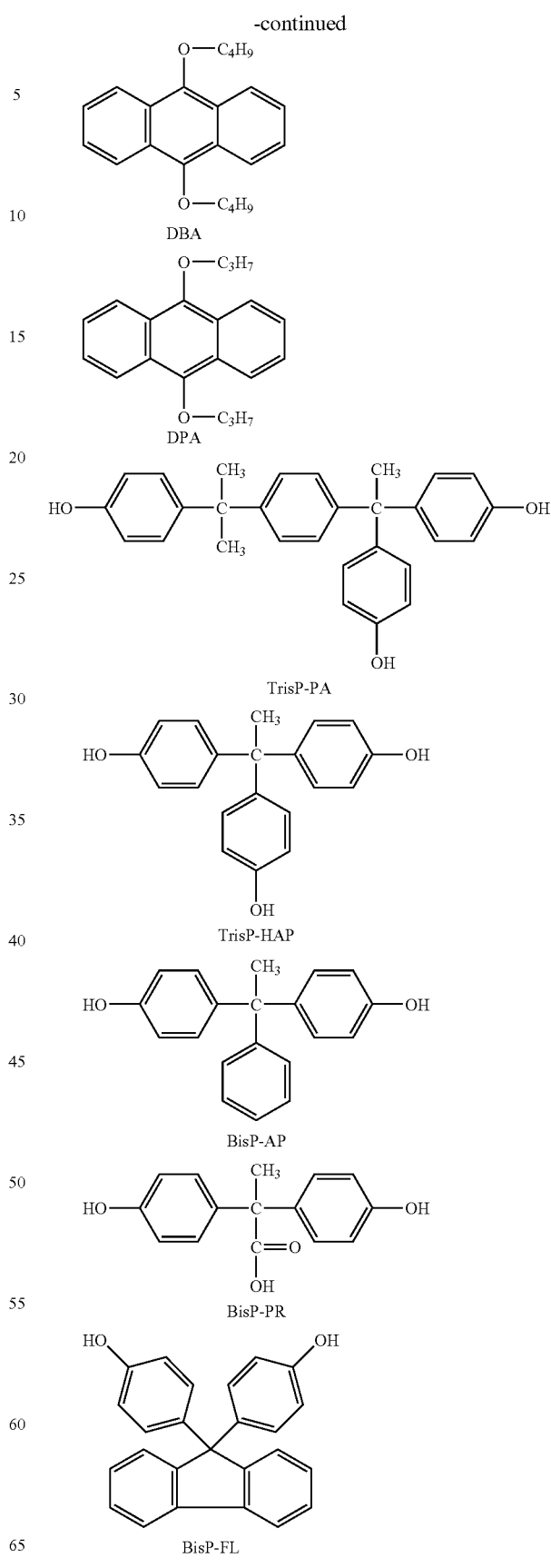

TABLE 1

| Composition | Polymer solution (weight) | Solvent (weight) | Quinone diazide compound (weight) | Heat cross-linking agent (weight) | Cross-linking promoter (weight) | Sensitizer (weight) | Solubility enhancer (weight) |
|---|---|---|---|---|---|---|---|
| 1 | Siloxane Polymer Solution (a) 100 | DAA/GBL = 90/10 200 | compound (a) 3 | | | | TrisP-PA 2 |
| 2 | Siloxane Polymer Solution (b) 100 | DAA/GBL = 80/20 200 | compound (b) 3 | | | | TrisP-HAP 2 |
| 3 | Siloxane Polymer Solution (c) 100 | DAA/GBL = 90/10 200 | compound (a) 3 | | | | TrisP-PA 2 |
| 4 | Siloxane Polymer Solution (e) 100 | MB/GBL = 70/30 200 | compound (a) 3 | | | | BisP-PR 2 |
| 5 | Siloxane Polymer Solution (f) 100 | DAA 200 | compound (c) 3 | | | | BisP-AP 2 |
| 6 | Siloxane Polymer Solution (a) 100 | DAA/GBL = 90/10 200 | compound (a) 3 | | | DBA 0.5 | TrisP-PA 2 |
| 7 | Siloxane Polymer Solution (a) 100 | DAA/GBL = 90/10 200 | compound (a) 3 | | NDI-105 0.2 | | TrisP-PA 2 |
| 8 | Siloxane Polymer Solution (a) 100 | DAA/GBL = 90/10 200 | compound (a) 3 | | NDI-105 0.2 | DBA 0.5 | TrisP-PA 2 |
| 9 | Siloxane Polymer Solution (a) 100 | DAA/GBL = 90/10 200 | compound (a) 7 | NIKALAC MX-270 2 | | | |
| 10 | Siloxane Polymer Solution (a) 100 | DAA/GBL = 90/10 200 | compound (a) 7 | NIKALAC MX-270 2 | 2-methyl benzyl-4-hydroxy phenyl methyl sulfonium trifluoromethane sulfonate 2 | | |
| 11 | Siloxane Polymer Solution (a) 100 | DAA/GBL = 90/10 200 | compound (a) 7 | NIKALAC MX-270 2 | NAI-105 0.3 | | |

TABLE 2

| Composition | Polymer solution (weight) | Solvent (weight) | Quinone diazide compound (weight) | Heat cross-linking agent (weight) | Cross-linking promoter (weight) | Sensitizer (weight) | Solubility enhancer (weight) |
|---|---|---|---|---|---|---|---|
| 12 | Siloxane Polymer Solution (a) 100 | DAA/GBL = 90/10 200 | compound (a) 7 | NIKALAC MX-270 2 | NDI-105 2 | DBA 0.2 | |
| 13 | Siloxane Polymer Solution (b) 100 | DAA/GBL = 80/20 200 | compound (a) 5 compound (b) 2 | TML-BPAF 2 | | | |
| 14 | Siloxane Polymer Solution (a) 100 | DAA/GBL = 90/10 200 | compound (a) 7 | n-propyltriethoxy silane 3 | NDI-109 2 | DPA 0.2 | |
| 15 | Siloxane Polymer Solution (b) 100 | DAA/GBL = 80/20 200 | compound (a) 5 compound (b) 2 | Tetraethoxy silane 3 | NDI-109 2 | DPA 0.2 | |
| 16 | Siloxane Polymer Solution (a) 100 | DAA/GBL = 90/10 200 | compound (a) 7 | EPIKOTE 828 1 | NDI-105 2 | DBA 0.2 | |
| 17 | Siloxane Polymer Solution (a) 100 | DAA/GBL = 90/10 200 | compound (a) 7 | (3-glycidoxypropyl) di methylethoxy silane 2 | NAI-105 0.3 | | |
| 18 | Siloxane Polymer Solution (a) 100 | DAA/GBL = 90/10 200 | compound (a) 5 compound (b) 2 | | NDI-109 2 | DBA 0.2 | BisP-FL 1 |
| 19 | Siloxane Polymer Solution (a) 100 | DAA/GBL = 90/10 200 | compound (a) 5 compound (b) 2 | | 2-methyl benzyl-4-hydroxy phenyl methyl sulfonium trifluoromethane sulfonate 1 | DBA 0.5 | |

TABLE 3

| Composition | Polymer solution (weight) | Solvent (weight) | Quinone diazide compound (weight) | Heat cross-linking agent (weight) | Cross-linking promoter (weight) | Sensitizer (weight) | Solubility enhancer (weight) |
|---|---|---|---|---|---|---|---|
| 20 | Siloxane Polymer Solution (a) 100 | DAA/GBL = 90/10 200 | compound (a) 7 | | NAI-109 2 | | N-hydroxy-5-norbornene-2,3-dicarboxyimide 0.2 |
| 21 | Siloxane Polymer Solution (c) 100 | DAA/GBL = 90/10 200 | compound (a) 6 | DMOM-PTBP 1 | NDI-105 0.5 | DBA 0.5 | |
| 22 | Siloxane Polymer Solution (c) 100 | DAA/GBL = 90/10 200 | compound (a) 6 | | [[(2-nitrobenzyl)oxy]carbonyl]cyclohexylamine 0.5 | DBA 0.5 | |

TABLE 3-continued

| Composition | Polymer solution (weight) | Solvent (weight) | Quinone diazide compound (weight) | Heat cross-linking agent (weight) | Cross-linking promoter (weight) | Sensitizer (weight) | Solubility enhancer (weight) |
|---|---|---|---|---|---|---|---|
| 23 | Siloxane Polymer Solution (a) 100 | DAA/GBL = 90/10 200 | compound (a) 15 | NIKALAC MX-270 2 | 2-methyl benzyl-4-hydroxy phenyl methyl sulfonium trifluoromethane sulfonate 1 | | |
| 24 | Siloxane Polymer Solution (a) 100 | DAA/GBL = 90/10 200 | compound (d) 3 | | | | TrisP-PA 2 |
| 25 | Siloxane Polymer Solution (d) 100 | DAA/GBL = 90/10 200 | compound (a) 3 | | | | TrisP-PA 2 |
| 26 | Siloxane Polymer Solution (g) 100 | DIBK 200 | compound (a) 3 | | | | TrisP-PA 2 |
| 27 | Acrylic Polymer Solution (h) 100 | EDM 230 | compound (e) 30 | | | | |

The compositions 2 to 27 were used to prepare cured films as described for Working Example 1, except that in Comparative Example 5 using the composition 27, the film thickness after pre-baking was 3 µm while 0.3 wt % tetramethylammonium hydroxide aqueous solution (ELM-D diluted by water) was used for shower development for 80 seconds, and that in Working Examples 9 to 22 and Comparative Example 1 using the compositions 9 to 23, curing was performed at 220° C. in air for 1 hour. The evaluation results of Working Examples and Comparative Examples are shown in Tables 4 to 6.

TABLE 4

| | Composition | Thickness of the prebaked coating (µm) | Normalized remaining film thickness(%) | Photosensitivity (J/m$^2$) | Cured coating Characteristic Thickness of the cured film (µm) |
|---|---|---|---|---|---|
| Example 1 | Composition 1 | 4 | 95 | 1000 | 3.7 |
| Example 2 | Composition 2 | 4 | 95 | 1000 | 3.7 |
| Example 3 | Composition 3 | 4 | 95 | 900 | 3.7 |
| Example 4 | Composition 4 | 4 | 95 | 1000 | 3.7 |
| Example 5 | Composition 5 | 4 | 95 | 1000 | 3.7 |
| Example 6 | Composition 6 | 4 | 99 | 800 | 3.8 |
| Example 7 | Composition 7 | 4 | 90 | 900 | 3.5 |
| Example 8 | Composition 8 | 4 | 99 | 800 | 3.8 |
| Example 9 | Composition 9 | 4 | 92 | 700 | 3.5 |
| Example 10 | Composition 10 | 4 | 92 | 700 | 3.5 |
| Example 11 | Composition 11 | 4 | 92 | 700 | 3.5 |
| Example 12 | Composition 12 | 4 | 92 | 650 | 3.5 |
| Example 13 | Composition 13 | 4 | 93 | 750 | 3.6 |
| Example 14 | Composition 14 | 4 | 95 | 900 | 3.6 |
| Example 15 | Composition 15 | 4 | 95 | 850 | 3.7 |
| Example 16 | Composition 16 | 4 | 96 | 900 | 3.7 |
| Example 17 | Composition 17 | 4 | 95 | 900 | 3.6 |

| | Cured coating Characteristic | | | | | |
|---|---|---|---|---|---|---|
| | Resolution of the cured film (µm) | Light transmittance (%) | Weight loss ratio (wt %) | Dielectric constant | Crack | Pencil Hardness |
| Example 1 | 5 | 99 | 1 | 3.1 | None | 3H |
| Example 2 | 5 | 98 | 1 | 3.1 | None | 3H |
| Example 3 | 5 | 97 | 1 | 3.1 | None | 3H |
| Example 4 | 5 | 96 | 1 | 3.1 | None | 3H |
| Example 5 | 5 | 98 | 1 | 3.1 | None | 3H |
| Example 6 | 5 | 98 | 1 | 3.1 | None | 3H |
| Example 7 | 5 | 98 | 1 | 3.1 | None | 4H |

TABLE 4-continued

| | | | | | | |
|---|---|---|---|---|---|---|
| Example 8 | 5 | 99 | 1 | 3.1 | None | 4H |
| Example 9 | 4 | 98 | 1 | 3.1 | None | 4H |
| Example 10 | 3 | 98 | 1 | 3.1 | None | 4H |
| Example 11 | 3 | 98 | 1 | 3.1 | None | 4H |
| Example 12 | 3 | 98 | 1 | 3.1 | None | 4H |
| Example 13 | 4 | 98 | 1 | 3.1 | None | 4H |
| Example 14 | 3 | 99 | 1 | 3.1 | None | 4H |
| Example 15 | 3 | 99 | 1 | 3.1 | None | 4H |
| Example 16 | 5 | 98 | 1 | 3.1 | None | 4H |
| Example 17 | 5 | 98 | 1 | 3.1 | None | 4H |

TABLE 5

| | | | | | Cured coating Characteristic | | | | | | |
|---|---|---|---|---|---|---|---|---|---|---|---|
| | Composition | Thickness of the prebaked coating (μm) | Normalized remaining film thickness(%) | Photo-sensitivity (J/m²) | Thickness of the cured film (μm) | Resolution of the cured film (μm) | Light transmittance (%) | Weight loss ratio (wt %) | Dielectric constant | Crack | Pencil Hardness |
| Example 18 | Composition 18 | 4 | 95 | 800 | 3.6 | 4 | 98 | 1 | 3.1 | None | 4H |
| Example 19 | Composition 19 | 4 | 98 | 800 | 3.7 | 3 | 98 | 1 | 3.1 | None | 4H |
| Example 20 | Composition 20 | 4 | 92 | 700 | 3.5 | 3 | 98 | 1 | 3.1 | None | 4H |
| Example 21 | Composition 21 | 4 | 92 | 700 | 3.5 | 4 | 98 | 1 | 3.1 | None | 4H |
| Example 22 | Composition 22 | 4 | 95 | 750 | 3.6 | 4 | 97 | 1 | 3.1 | None | 4H |
| Comparative example 1 | Composition 23 | 4 | 98 | 900 | 3.7 | 10 | 93 | 1 | 3.1 | None | 4H |
| Comparative example 2 | Composition 24 | 4 | 95 | 1000 | 3.7 | 5 | 90 | 1 | 3.1 | None | 3H |
| Comparative example 3 | Composition 25 | 4 | 95 | 1000 | 3.7 | 50 | 90 | 1 | 3.1 | None | 3H |
| Comparative example 4 | Composition 26 | 4 | 95 | 2000 | 3.7 | 10 | 92 | 1 | 3.1 | None | 3H |
| Comparative example 5 | Composition 27 | 3 | 95 | 1300 | 2.8 | 5 | 85 (Yellow) | 7 | 3.4 | None | 4H |

TABLE 6

| | Composition | $x_0$ | $y_0$ | $x$ | $y$ | $(x - x_0)^2 + (y - y_0)^2$ |
|---|---|---|---|---|---|---|
| Example 1 | Composition 1 | 0.3101 | 0.3162 | 0.3106 | 0.3168 | $0.6 \times 10^{-6}$ |
| Example 2 | Composition 2 | 0.3101 | 0.3162 | 0.3108 | 0.317 | $1.1 \times 10^{-6}$ |
| Example 3 | Composition 3 | 0.3101 | 0.3162 | 0.3112 | 0.3174 | $2.7 \times 10^{-6}$ |
| Example 4 | Composition 4 | 0.3101 | 0.3162 | 0.311 | 0.3171 | $1.6 \times 10^{-6}$ |
| Example 5 | Composition 5 | 0.3101 | 0.3162 | 0.3108 | 0.3169 | $1.0 \times 10^{-6}$ |
| Example 6 | Composition 6 | 0.3101 | 0.3162 | 0.3106 | 0.3169 | $0.7 \times 10^{-6}$ |
| Example 7 | Composition 7 | 0.3101 | 0.3162 | 0.3107 | 0.317 | $1.0 \times 10^{-6}$ |
| Example 8 | Composition 8 | 0.3101 | 0.3162 | 0.3107 | 0.317 | $1.0 \times 10^{-6}$ |
| Example 9 | Composition 9 | 0.3101 | 0.3162 | 0.3109 | 0.3171 | $1.5 \times 10^{-6}$ |
| Example 10 | Composition 10 | 0.3101 | 0.3162 | 0.3108 | 0.3171 | $1.3 \times 10^{-6}$ |
| Example 11 | Composition 11 | 0.3101 | 0.3162 | 0.3109 | 0.3172 | $1.6 \times 10^{-6}$ |
| Example 12 | Composition 12 | 0.3101 | 0.3162 | 0.3107 | 0.3171 | $1.2 \times 10^{-6}$ |
| Example 13 | Composition 13 | 0.3101 | 0.3162 | 0.311 | 0.3174 | $2.3 \times 10^{-6}$ |
| Example 14 | Composition 14 | 0.3101 | 0.3162 | 0.3107 | 0.317 | $1.0 \times 10^{-6}$ |
| Example 15 | Composition 15 | 0.3101 | 0.3162 | 0.3109 | 0.3172 | $1.6 \times 10^{-6}$ |
| Example 16 | Composition 16 | 0.3101 | 0.3162 | 0.3107 | 0.3171 | $1.2 \times 10^{-6}$ |
| Example 17 | Composition 17 | 0.3101 | 0.3162 | 0.3106 | 0.3166 | $0.4 \times 10^{-6}$ |
| Example 18 | Composition 18 | 0.3101 | 0.3162 | 0.311 | 0.3173 | $2.0 \times 10^{-6}$ |
| Example 19 | Composition 19 | 0.3101 | 0.3162 | 0.3109 | 0.3172 | $1.6 \times 10^{-6}$ |
| Example 20 | Composition 20 | 0.3101 | 0.3162 | 0.3108 | 0.317 | $1.1 \times 10^{-6}$ |
| Example 21 | Composition 21 | 0.3101 | 0.3162 | 0.3111 | 0.3175 | $2.7 \times 10^{-6}$ |
| Example 22 | Composition 22 | 0.3101 | 0.3162 | 0.311 | 0.3175 | $2.5 \times 10^{-6}$ |
| Comparative example 1 | Composition 23 | 0.3101 | 0.3162 | 0.3119 | 0.3183 | $7.7 \times 10^{-6}$ |
| Comparative example 2 | Composition 24 | 0.3101 | 0.3162 | 0.3121 | 0.3188 | $10.8 \times 10^{-6}$ |
| Comparative example 3 | Composition 25 | 0.3101 | 0.3162 | 0.3121 | 0.3187 | $10.3 \times 10^{-6}$ |

TABLE 6-continued

| Composition | | $x_0$ | $y_0$ | x | y | $(x - x_0)^2 + (y - y_0)^2$ |
|---|---|---|---|---|---|---|
| Comparative example 4 | Composition 26 | 0.3101 | 0.3162 | 0.3118 | 0.3181 | $6.5 \times 10^{-6}$ |
| Comparative example 5 | Composition 27 | 0.3101 | 0.3162 | 0.3123 | 0.3189 | $12.1 \times 10^{-6}$ |

The invention claimed is:

1. A positive photosensitive siloxane composition comprising a siloxane polymer, quinonediazide compound and solvent, wherein the light transmittance of a cured film formed of the composition-per 3 μm film thickness is 95% or more at a wavelength of 400 nm, and wherein the siloxane polymer contains 5 to 60 mol % phenyl groups based on the amount of Si atoms in the siloxane polymer.

2. A positive photosensitive siloxane composition comprising a siloxane polymer, quinonediazide compound and solvent, wherein the chromaticity coordinates (x, y) of the light transmitted through a 3 μm thick cured film formed of the composition in the XYZ color system using light source C or light source F10 are $(x-x_0)^2+(y-y_0)^2 \leq 6 \times 10^{-6}$ in reference to the chromaticity coordinates $(x_0, y_0)$ of the light source C or light source F10, and wherein the siloxane polymer contains 5 to 60 mol % phenyl groups based on the amount of Si atoms in the siloxane polymer.

3. A positive photosensitive siloxane composition according to claim 1 or 2, wherein the photosensitivity in exposure to an ultra high pressure mercury lamp is 100 to 1500 J/m² in terms of wavelength 365 nm exposure energy value.

4. A positive photosensitive siloxane composition according to claim 1 or 2, wherein the content of the quinonediazide compound is from 0.1 to 10 wt % based on the weight of the siloxane polymer.

5. A positive photosensitive siloxane composition according to claim 1 or 2, wherein the content of the quinonediazide compound is from 0.1 to 4 wt % based on the weight of the siloxane polymer.

6. A positive photosensitive siloxane composition according to claim 1 or 2, wherein the quinonediazide compound is a compound in which the sulfonic acid of naphthoquinonediazide is ester-bonded to a compound having a phenolic hydroxyl group, and the ortho position and the para position of the phenolic hydroxyl group of said compound are, respectively independently, occupied by a hydrogen atom or a substituent group represented by the following formula (1):

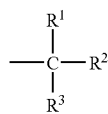
(1)

wherein $R^1$, $R^2$ and $R^3$ denote, respectively independently, an alkyl group with 1 to 10 carbon atoms, carboxyl group, phenyl group or substituted phenyl group; and $R^1$, $R^2$ and $R^3$ may also form a ring.

7. A positive photosensitive siloxane composition according to claim 1 or 2, wherein the content of the phenolic hydroxyl groups in the siloxane polymer is 20 mol % or less based on the amount of Si atoms.

8. A positive photosensitive siloxane composition according to claim 1 or 2, wherein the solvent is a compound having an alcoholic hydroxyl group and/or a cyclic compound having a carbonyl group.

9. A positive photosensitive siloxane composition according to claim 8, wherein the compound having an alcoholic hydroxyl group is a compound comprising a carbonyl group.

10. A positive photosensitive siloxane compound according to claim 1 or 2, comprising a heat crosslinking agent.

11. A positive photosensitive siloxane composition according to claim 10, wherein the heat crosslinking agent is a compound having two or more groups respectively represented by the general formula (2) and/or a compound represented by the general formula (3)

(2)

wherein $R^4$ denotes a hydrogen atom or alkyl group with 1 to 10 carbon atoms; in the compound, plural $R^4$ s can be identical with or different from each other,

(3)

wherein $R^5$ denotes a hydrogen atom, alkyl group with 1 to 10 carbon atoms, alkenyl group with 2 to 10 carbon atoms or aryl group with 6 to 15 carbon atoms, and plural $R^5$s can be identical with or different from each other; $R^6$ denotes a hydrogen atom, alkyl group with 1 to 6 carbon atoms, acyl group with 2 to 6 carbon atoms or aryl group with 6 to 15 carbon atoms, and plural $R^6$s can be identical with or different from each other; and n denotes an integer of 0 to 2.

12. A positive photosensitive siloxane composition according to claim 1 or 2, comprising a crosslinking promoter.

13. A positive photosensitive siloxane composition according to claim 12, wherein the crosslinking promoter is a compound capable of generating an acid when heated or when exposed to light.

14. A positive photosensitive siloxane composition according to claim 12, wherein the crosslinking promoter is a compound capable of generating a base when heated or when exposed to light.

15. A positive photosensitive siloxane composition according to claim 1 or 2, wherein the crosslinking promoter is a sulfonium salt or a sulfone imide compound.

16. A positive photosensitive siloxane composition according to claim 1 or 2, comprising a sensitizer.

17. A positive photosensitive siloxane composition according to claim 16, wherein the sensitizer is vaporized when heat-treated and/or fades when irradiated with light.

18. A positive photosensitive siloxane composition according to claim 16, wherein the sensitizer is an anthracene-based compound.

19. A cured film formed from the positive photosensitive siloxane composition as set forth in claim 1 or 2.

20. An element comprising the cured film as set forth in claim 19.

* * * * *